United States Patent [19]

Kimura

[11] Patent Number: 5,523,717
[45] Date of Patent: Jun. 4, 1996

[54] OPERATIONAL TRANSCONDUCTANCE AMPLIFIER AND BI-MOS MULTIPLIER

[75] Inventor: Katsuji Kimura, Tokyo, Japan

[73] Assignee: NEC Corporation, Tokyo, Japan

[21] Appl. No.: 339,268

[22] Filed: Nov. 10, 1994

[30] Foreign Application Priority Data

Nov. 10, 1993 [JP] Japan .................................. 5-304686
Nov. 15, 1993 [JP] Japan .................................. 5-284651

[51] Int. Cl.$^6$ ........................................ H03F 3/45
[52] U.S. Cl. .......................... 330/252; 330/253; 327/357; 327/359
[58] Field of Search ..................... 330/252, 253, 330/254; 327/356, 357, 359

[56] References Cited

U.S. PATENT DOCUMENTS 5,006,818  4/1991  Koyama et al. .................. 330/261

FOREIGN PATENT DOCUMENTS

| 0171653 | 2/1986 | European Pat. Off. . |
| 60-146371 | 8/1985 | Japan . |
| 61-105912 | 5/1986 | Japan . |
| 3-4615 | 1/1991 | Japan . |
| 3-75977 | 3/1991 | Japan . |

OTHER PUBLICATIONS

H. Khorramabadi, "High–Frequency CMOS Continuous Time Filters", University Microfilms International, 1985, pp. 51–71.

K. Kimura, "A Unified Analysis of Four–Quadrant Analog Multipliers Consisting of Emitter and Source–Coupled Transistors Operable on Low Supply Voltage", IEICE Trans. Electron., May 1993, vol. E76–C, No. 5, pp. 715–737.

Primary Examiner—James B. Mullins
Attorney, Agent, or Firm—Young & Thompson

[57] ABSTRACT

An operational transconductance amplifier having a good transconductance linearlity within a wide input voltage range that can be realized easily without increase in chip area. There are a first balanced differential pair of first and second MOS transistors that are driven by a first constant current source, and a second balanced differential pair of third and fourth MOS transistors that are driven by a second constant current source. The first, second, third and fourth transistors have the same transconductance parameter. Drains of the first and fourth transistors are coupled together and drains of the second and third transistors are coupled together. A differential output current of the amplifier is derived from the output ends of the first and fourth transistors and the output ends of the second and third transistors. Gates of the first and third transistors are applied with an input voltage. Gates of the third and fourth transistors are applied with a voltage produced by dividing the input voltage.

12 Claims, 14 Drawing Sheets

OPERATIONAL TRANSCONDUCTANCE AMPLIFIER AND BI-MOS MULTIPLIER

BACKGROUND OF THE INVENTION

1. Field of the Invention

The present invention relates to an operational transconductance amplifier (OTA) for amplifying an input signal with a linear transconductance and a multiplier for multiplying two input signals, and more particularly, to an OTA to be realized on metal-oxide-semiconductor (MOS) integrated circuits and a multiplier operable within wider input voltage ranges and to be realized on bipolar-MOS (Bi-MOS) integrated circuits.

2. Description of the Prior Art

FIG. 1 shows a conventional OTA of this type that has the simplest configuration, which is disclosed in Ph.D. dissertation, University of California, Berkeley, Calif., 1985, entitled "High-frequency CMOS continuous time filters" written by E. Khorramabadi. This OTA is composed of first and second source-coupled pairs of MOS field-effect transistors (MOSFET) whose drains are cross-coupled, and is termed an MOSOTA.

As shown in FIG. 1, n-channel MOS transistors M11 and M12 with the same transconductance parameter $\beta_1$ form a first balanced differential pair that is driven by a first constant current source (current: $I_{SS1}$). N-channel MOS transistors M13 and M14 with the same transconductance parameter $\beta_2$ form a second balanced differential pair that is driven by a second constant current source (current: $I_{SS2}$), where $\beta_1 \approx \beta_2$.

Sources of the first and second transistors M11 and M12 are coupled together to be connected to the first current source. Sources of the third and fourth transistors M13 and M14 are coupled together to be connected to the second current source.

Gates of the transistors M11 and M13 are coupled together to be connected to one end 11 of an input end pair. Gates of the transistors M12 and M14 are coupled together to be connected to the other end 12 of the input end pair. An input voltage $V_i$ is applied across the pair of input ends 11 and 12.

Drains of the transistors M11 and M14 are coupled together and drains of the transistors M12 and M13 are coupled together. A differential output current $\Delta I$ of the conventional MOSOTA is derived from the coupled drains of the transistors M11 and M14 and those of the transistors M12 and M13.

The differential output current $\Delta I$ is obtained in the following manner:

Here, drain currents of the transistors M11, M12, M13 and M14 are defined as $I_{D11}$, $I_{D12}$, $I_{D13}$, $I_{D14}$, respectively; then, the differential output current $\Delta I$ can be expressed as $$\Delta I = (I_{D11} + I_{D14}) - (I_{D12} + I_{D13}).$$

The transconductance parameters $\beta_1$ and $\beta_2$ are defined as $\beta_1 = \mu(C_{ox}/2)(W1/L1)$ and $\beta_2 = \mu(C_{ox}/2)(W2/L2)$ where $\mu$ is the effective surface mobility of a carrier, $C_{ox}$ is the gate oxide capacitance per unit area, W1 and L1 are a gate-width and a gate-length of the transistors M11 and M12 and W2 and L2 are a gate-width and a gate-length of the transistors M13 and M14, respectively. Also, $C_{ox}$ is expressed as $(\epsilon_{ox}/t_{ox})$ where $\epsilon_{ox}$ and $t_{ox}$ are the dielectric constant and the thickness of the gate oxide, respectively.

A differential output current $\Delta I_{11}$ ($=I_{D11}-I_{D12}$) of the first balanced differential pair is expressed by the following equations (1a) and (1b) as $$\Delta I_{11} = \beta_1 V_i \sqrt{\left(\frac{2I_{SS1}}{\beta_1}\right) - (V_i^2)} \quad \left(|V_i| \leq \sqrt{\frac{I_{SS1}}{\beta_1}}\right) \tag{1a}$$

$$\Delta I_{11} = I_{SS1} S_{gn}(V_i) \quad \left(|V_i| \geq \sqrt{\frac{I_{SS1}}{\beta_1}}\right) \tag{1b}$$

Similarly, a differential output current $\Delta I_{12}$ ($=I_{D14}-I_{D13}$) of the second balanced differential pair is expressed by the following equations (2a) and (2b) as $$\Delta I_{12} = \beta_2 V_i \sqrt{\left(\frac{2I_{SS2}}{\beta_2}\right) - (V_i^2)} \quad \left(|V_i| \leq \sqrt{\frac{I_{SS2}}{\beta_2}}\right) \tag{2a}$$

$$\Delta I_{12} = I_{SS2} S_{gn}(V_i) \quad \left(|V_i| \geq \sqrt{\frac{I_{SS2}}{\beta_1}}\right) \tag{2b}$$

Here, assuming that $(I_{SS1}/\beta_1)^{1/2} > (I_{SS2}/\beta_1)^{1/2}$ since generality is not lost, the differential output current $\Delta I$ of the conventional MOSOTA can be expressed by the following equation (3) as $$\begin{aligned}\Delta I &= \Delta I_{11} - \Delta I_{12} \\ &= \beta_1 V_i \sqrt{\left(\frac{2I_{SS1}}{\beta_1}\right) - (V_i^2)} - \\ &\quad \beta_2 V_i \sqrt{\left(\frac{2I_{SS2}}{\beta_2}\right) - (V_i^2)}\end{aligned} \tag{3}$$

where $|V_i| \leq (I_{SS2}/\beta_2)^{1/2}$.

The equation (3) can be approximated by the following equation (4) that is obtained by using an approximation equation disclosed in ICICE Transactions on Electronics, Vol. E76-C, No. 5, pp 720, May 1993, entitled "A Unified Analysis of Four-Quadrant Analog Multipliers Consisting of Emitter- and Source-Coupled Transistors Operable on Low Supply Voltage" written by the inventor, K. KIMURA.

$$\Delta I = \sqrt{2\beta_1 I_{SS1}} \cdot V_i \left( \frac{1 - \left(1 - \sqrt{\frac{1}{2}}\right) \cdot V_i^2}{(I_{SS1}/\beta_1)} \right) - \sqrt{2\beta_2 I_{SS2}} \cdot V_i \left( \frac{1 - \left(1 - \sqrt{\frac{1}{2}}\right) \cdot V_i^2}{(I_{SS2}/\beta_2)} \right) \tag{4}$$

To make the transconductance of the MOSOTA linear in the equation (3), all of the quadratic and higher terms of the input voltage $V_i$ need to be zero. This means that the cubic term of $V_i$, i.e., $V_i^3$ in the equation (4) needs to be zero.

Therefore, the necessary condition for making the transconductance of the conventional MOSOTA linear can be expressed by the following equation (5) as $$\frac{\beta_1 \sqrt{\beta_1}}{\beta_2 \sqrt{\beta_2}} = \frac{\sqrt{I_{SS1}}}{\sqrt{I_{SS2}}} \tag{5}$$

The input-output and transconductance characteristics of the conventional MOSOTA in FIG. 1, which are obtained under the above condition (5), are shown in FIGS. 2 and 3, respectively.

The transconductance characteristic curves T1 to T12 shown in FIG. 3 are obtained under the conditions in the table 1 shown below where $$X = \frac{(I_{SS1}/I_{SS2})}{(\beta_1/\beta_2)}$$

TABLE 1

| CHARACTERISTIC | X | $I_{SS2}$ | $\beta_2$ |
|---|---|---|---|
| T1 | 0.49 | 0 | — |
| T2 |  | 0.242 $I_{SS1}$ | 0.495 $\beta_1$ |
| T3 |  | 0.277 $I_{SS1}$ | 0.566 $\beta_1$ |
| T4 | 0.5625 | 0.318 $I_{SS1}$ | 0.566 $\beta_1$ |
| T5 |  | 0.375 $I_{SS1}$ | 0.667 $\beta_1$ |
| T6 |  | 0.398 $I_{SS1}$ | 0.707 $\beta_1$ |
| T7 | 0.5916 | 0.377 $I_{SS1}$ | 0.637 $\beta_1$ |
| T8 | 0.7 | 0.410 $I_{SS1}$ | 0.586 $\beta_1$ |
| T9 |  | 0.471 $I_{SS1}$ | 0.674 $\beta_1$ |
| T10 |  | 0.512 $I_{SS1}$ | 0.732 $\beta_1$ |
| T11 |  | 0.525 $I_{SS1}$ | 0.751 $\beta_1$ |
| T12 | 0.81 | 0.680 $I_{SS1}$ | 0.839 $\beta_1$ |

From the characteristics shown in FIGS. 2 and 3, it is seen that the transconductance only changes within about 4% over 70% of the operable input voltage range or more, and as a result, the linearity of the transconductance characteristic is improved in a sufficient wide input voltage range without using a complex circuit.

To realize the conventional MOSOTA on an LSI, it is required that the transconductance parameter ratio ($\beta_2/\beta_1$) i.e., (W2/L2)/(W1/L1) has a specified value and that the driving current ratio ($I_{SS2}/I_{SS1}$) also has a specified value. Further, to make the ratios possibly exact, the values of the transconductance parameter ratio ($\beta_2/\beta_1$) and the driving current ratio ($I_{SS2}/I_{SS1}$) need to be either natural numbers or ratios of natural numbers, respectively.

Therefore, unit MOS transistors has to be employed in order to realize at least one of a desired value of the transconductance parameter ratio ($\beta_2/\beta_1$) and a desired value of the driving current ratio ($I_{SS2}/I_{SS1}$), which increases the number of the transistors incorporated and the chip occupation area of the conventional MOSOTA.

On the other hand, FIG. 4 shows a conventional Bi-MOS multiplier, which is composed of cross-coupled, emitter-coupled pairs 50 of npn bipolar transistors Q11, Q12, Q13 and Q14 and a source-coupled pair 60 of MOS field-effect transistors M15 and M16. The cross-coupled, emitter-coupled pairs 50 are applied with a first input voltage $V_1$ and the source-coupled pair 60 is applied with a second input voltage $V_2$. The source-coupled pair 60 is driven by a constant current source (current: $I_0$).

In detail, the cross-coupled, emitter-coupled pair 50 is composed of a first emitter-coupled pair of npn transistors Q11 and Q12 whose collectors are coupled together and a second emitter-coupled pair of npn transistors Q13 and Q14 whose collectors are coupled together.

The coupled collectors of the transistors Q11 and Q13 are connected to one end 56 of an output end pair. The coupled collectors of the transistors Q12 and Q14 are connected to the other end 57 of the output end pair. A differential output current $\Delta I_{OUT}$ of the conventional Bi-MOS multiplier is derived from the pair of the output ends 56 and 57.

Bases of the transistors Q11 and Q14 are coupled together to be connected to one end 51 of a first input end pair. Bases of the transistors Q12 and Q13 are coupled together to be connected to the other end 52 of the first input end pair. The first input voltage $V_1$ is applied across the first pair of the input ends 51 and 52.

The source-coupled pair 60 is composed of n-channel MOS transistors M15 and M16 whose sources are coupled together to be connected to the constant current source.

A drain of the transistor M15 is connected to the coupled emitters of the bipolar transistors Q11 and Q12. A drain of the transistor M16 is connected to the coupled emitters of the bipolar transistors Q13 and Q14. A differential output current $\Delta I_{10}$ is outputted from the drains of the MOS transistors M15 and M16 to drive the cross-coupled, emitter-coupled pairs 50.

A gate of the MOS transistor M15 is connected to one end 61 of a second input end pair. A base of the transistor M16 is connected to the other end 62 of the second input end pair. The second input voltage $V_2$ is applied across the second pair of the input ends 61 and 62.

The differential output current $\Delta I_{OUT}$ of the conventional Bi-MOS multiplier is expressed by the following equations (6a) and (6b) as $$\Delta I_{OUT} = \alpha_{Fn}\beta \left( V_2 \sqrt{\frac{2I_0}{\beta} - V_2^2} \right) \tanh\left( \frac{V_1}{2V_T} \right) \quad (6a)$$

$$\left( |V_2| \leq \sqrt{\frac{2I_0}{\beta}} \right)$$

$$\Delta I_{OUT} = \alpha_{Fn} I_0 \text{Sgn}(V_2) \tanh\left( \frac{V_1}{2V_T} \right) \quad (6b)$$

$$\left( |V_2| \geq \sqrt{\frac{2I_0}{\beta}} \right)$$

In the equations (6a) and (6b), $\alpha_{Fn}$ is the dc common-base current gain factor of an npn bipolar transistor, $\beta$ is the transconductance parameters of the MOS transistors M15 and M16, and $V_T$ is the thermal voltage that is expressed as $V_T = kT/q$ where k is Boltzmann's constant, T is absolute temperature in degrees Kelvin and q is the charge of an electron.

From the equations (6a) and (6b), it can be confirmed that in the cross-coupled, emitter-coupled pairs 50, the non-linearity of the differential output current $\Delta I_{OUT}$ is −7.6% when $V_1 = 2V_T$ so that the absolute value of the first input voltage $V_1$ is limited to less than $2V_T$, i.e., $|V_1| < 2V_T$.

It can also be confirmed that in the source-coupled pair 60, the input voltage range for the second input voltage $V_2$ is decided by a ratio of the driving current $I_0$ and the transconductance parameter $\beta$, i.e., ($I_0/\beta$), so that the non-linearity of the differential output current $\Delta I_{10}$ is 7% or less when the second input voltage $V_2$ is less than $0.5 \cdot ((2I_0)/\beta)^{1/2}$, i.e., $|V_2| < 0.5 \cdot [(2I_0)/\beta]^{1/2}$.

As described above, with the conventional Bi-MOS multiplier in FIG. 4, as shown in the equations (6a) and (6b), the driving current $I_0$ needs to be increased in order to widen the input voltage range for the second input voltage $V_2$.

There are other related prior art as follows:

The Japanese Non-Examined Patent Publication No. 60-146371 (August, 1985) discloses a CMOS analog multiplier with a wide dynamic range. The CMOS analog multiplier contains a first different pair of first and second MOSFETs whose sources are coupled together and a second differential pair of third and fourth MOSFETs whose sources are coupled together.

The coupled sources of the first and second MOSFETs are connected to a first constant current sink and the coupled sources of the third and fourth MOSFETs are connected to a second constant current sink.

Gates of the first and second MOSFETs are coupled together to be connected to one end of a first input end pair. Gates of the third and fourth MOSFETs are coupled together to be connected to the other end of the first input end pair. A first input voltage to be multiplied is applied across the first input end pair.

Substrates of the first and second MOSFETs are coupled together to be connected to one end of a second input end pair. Substrates of the third and fourth MOSFETs are coupled together to be connected to the other end of the second input end pair. A second input voltage to be multiplied is applied across the second input end pair.

Drains of the first and third MOSFETs are coupled together to be connected to a first load. Drains of the second and fourth MOSFETs are coupled together to be connected to a second load. A first input voltage to be multiplied is applied across the first input end pair.

The Japanese Non-Examined Patent Publication No. 61-105912 (May, 1986) discloses a mixer circuit that can be easily formed on semiconductor integrated circuits and that can provide a sufficient conversion gain even while the input signal is small in amplitude.

The mixer circuit contains a double-balanced multiplier with two inputs and one output and a differential amplifier for amplifying two input signals and applying the input signals thus amplified to the multiplier differentially. The multiplier and the differential amplifier are composed of bipolar transistors, respectively.

The Japanese Non-Examined Patent Publication No. 3-4615 (January, 1991) discloses a multiplier in which an improved efficiency for taking out the frequency component of a clock signal can be obtained.

The multiplier contains first and second differential pairs of bipolar transistors whose respective emitters have resistors in order to widen the linear range of the input-output characteristics.

The Japanese Non-Examined Patent Publication No. 3-75977 (March, 1991) discloses a multiplier in which an output with a square-law characteristic can be obtained efficiently even if a difference between the dc biases to positive- and opposite-phase input signals.

The multiplier contains first and second differential amplifiers of bipolar transistors that are driven by the respective driving currents equal in value to each other provided at an input stage of the multiplier. First and second outputs are derived from first and second load resistances of the differential amplifiers. The first and second outputs are inputted into the multiplier through emitter followers, respectively.

SUMMARY OF THE INVENTION

An object of the present invention is to provide an OTA in which a good transconductance linearlity within a wide input voltage range can be realized easily without increase in chip area.

Another object of the present invention is to provide an OTA that can be realized by common-sized transistors.

Still another object of the present invention is to provide a Bi-MOS multiplier in which a wider input voltage range can be obtained than the conventional one shown in FIG. 4 without increase in driving current.

According to a first aspect of the present invention, an OTA is provided, which contains a first balanced differential pair of first and second transistors, a first constant current source for driving the first balanced differential pair, a second balanced differential pair of third and fourth transistors, and a second constant current source for driving the second balanced differential pair.

The first, second, third and fourth transistors have the same capability, in other words, the same transconductance parameter in MOS transistors, and the same emitter area or size in bipolar transistors.

Output ends of the first and fourth transistors are coupled together and output ends of the second and third transistors are coupled together.

A differential output current of the OTA is derived from the coupled output ends of the first and fourth transistors and the coupled output ends of the second and third transistors.

Input ends of the first and third transistors are applied with an input voltage.

There is voltage-dividing means for dividing the input voltage to produce a divided voltage with a divide ratio of $C_1$ ($C_1 > 1$). Input ends of the third and fourth transistors are applied with the divided voltage.

As the above first to fourth transistors, not only MOS field-effect transistors but also bipolar transistors may be used; however, MOS transistors are preferable.

Preferably, the divided voltage ($V_1/C_1$) is produced by a first resistor connected between the input ends of the first and third transistors, a second resistor connected between the input ends of the second and fourth transistors, and a third resistor connected between the input ends of the third and fourth transistors. Preferable, the first and second resistors have the same resistance, and the third resistor has a different resistance from those of the first and second resistors.

With the OTA of the first aspect of the present invention, the input voltage $V_i$ is directly applied with the input ends of the first and second transistors and the divided voltage ($V_i/C_1$) produced by dividing the input voltage $V_i$ is applied with the input ends of the third and fourth transistors. Therefore, the applied voltage to the input ends of the third and fourth transistors can be changed according to the divide ratio $C_1$ of the voltage-dividing means.

Thus, the applied voltage to the second balanced differential pair can be controlled by the voltage-dividing means, which makes the capabilities of the first and second balanced differential pairs different without changing the capabilities of the third and fourth transistors of the second balanced differential pair.

As a result, the first and second differential pairs can be composed of not only unit transistors but also any other transistors with the same capability, so that the OTA can be realized easily by using common-sized transistors without increase in chip area of the OTA.

According to a second aspect of the present invention, a Bi-MOS multiplier is provided, which contains a cross-coupled, emitter-coupled pairs applied with a first input voltage and a cross-coupled, source-coupled pairs applied with a second input voltage. The cross-coupled, emitter-coupled pairs are driven by a differential output current of the cross-coupled, source-coupled pairs.

The cross-coupled, emitter-coupled pairs are composed of a first differential pair of first and second bipolar transistors whose emitters are coupled together and a second differential pair of third and fourth bipolar transistors whose emitters are coupled together.

The collectors of the first and third bipolar transistors are coupled together and the collectors of the second and fourth bipolar transistors are coupled together. A differential output current of the multiplier is derived from the coupled collectors of the first and third transistors and the coupled collectors of the second and fourth transistors.

Bases of the first and fourth transistors are coupled together and bases of the second and third transistors are coupled together. The first input voltage is applied across the coupled bases of the first and fourth transistors and the coupled bases of the second and third transistors.

The cross-coupled, source-coupled pairs are composed of a third balanced differential pair of first and second MOS field-effect transistors whose sources are coupled together, and a fourth balanced differential pair of third and fourth MOS field-effect transistors whose sources are coupled together.

The first and second MOS transistors have the same transconductance parameter $\beta_{11}$ and the third and fourth MOS transistors have the same transconductance parameter $\beta_{12}$.

The coupled sources of the first and second MOS transistors are connected to a first constant current source whose constant current is $I_{01}$, and the coupled sources of the third and fourth MOS transistors are connected to a second constant current source whose constant current is $I_{02}$.

Drains of the first and fourth MOS transistors are coupled together to be connected to the coupled emitters of the first and second bipolar transistors. Drains of the second and third MOS transistors are coupled together to be connected to the coupled emitters of the third and fourth bipolar transistors. The differential output current of the cross-coupled, source-coupled pairs is outputted from the coupled drains of the first and fourth MOS transistors and the coupled drains of the second and third MOS transistors.

Gates of the first and third MOS transistors are coupled together and gates of the second and fourth transistors are coupled together. The second input voltage is applied across the coupled gates of the first and third MOS transistors and the coupled gates of the second and fourth transistors.

The currents $I_{01}$ and $I_{02}$ of the first and second constant current sources and the transconductance parameters $\beta_{11}$ and $\beta_{12}$ of the first, second, third and fourth MOS transistors have such a relationship as $$\left(\frac{\beta_{11}}{\beta_{12}}\right)^{3/2} = \sqrt{\frac{I_{01}}{I_{02}}}$$

With the Bi-MOS multiplier of the second aspect of the invention, since the currents $I_{01}$ and $I_{02}$ of the first and second constant current sources and the transconductance parameters $\beta_{11}$ and $\beta_{12}$ have the above relationship, linearity of the output differential current of the cross-coupled, source-coupled pairs is improved. As a result, a wider input voltage range can be obtained than the conventional one shown in FIG. 4 with no increase of the currents $I_{01}$ and $I_{02}$.

According to a third aspect of the present invention, another Bi-MOS multiplier is provided. Similar to the multiplier of the second aspect, the multiplier of the third aspect contains a cross-coupled, emitter-coupled pairs applied with a first input voltage and a cross-coupled, source-coupled pairs applied with a second input voltage. The cross-coupled, emitter-coupled pairs are driven by a differential output current of the cross-coupled, source-coupled pairs.

The cross-coupled, emitter-coupled pairs are the same in configuration as those of the multiplier of the second aspect.

The cross-coupled, source-coupled pairs are composed of a third balanced differential pair of first and second MOS field-effect transistors whose sources are coupled together, and a fourth balanced differential pair of third and fourth MOS field-effect transistors whose sources are coupled together.

The first, second, third and fourth MOS transistors have the same transconductance parameter $\beta_{13}$.

The coupled sources of the first and second MOS transistors are connected to a first constant current source whose constant current is $I_{11}$, and the coupled sources of the third and fourth MOS transistors are connected to a second constant current source whose constant current is $I_{12}$.

Drains of the first and fourth MOS transistors are coupled together to be connected to the coupled emitters of the first and second bipolar transistors. Drains of the second and third MOS transistors are coupled together to be connected to the coupled emitters of the third and fourth bipolar transistors. The differential output current of the cross-coupled, source-coupled pairs are outputted from the coupled drains of the first and fourth MOS transistors and the coupled drains of the second and third MOS transistors.

The second input voltage is applied across gates of the first and second MOS transistors and a voltage produced by dividing the second input voltage at a divide ratio $C_2$ ($C_2>1$) is applied across gates of the third and fourth MOS transistors.

The currents $I_{11}$ and $I_{12}$ of the first and second constant current sources and the divide ratio $C_2$ have such a relationship as $$C_2^3 = \sqrt{\frac{I_{11}}{I_{12}}}$$

With the Bi-MOS multiplier of the third aspect, the currents $I_{11}$ and $I_{12}$ of the first and second constant current sources and the divide ratio $C_2$ have the above relationship, linearity of the output differential current of the cross-coupled, source-coupled pairs is improved. As a result, a wider input voltage range can be obtained than the conventional one shown in FIG. 4 with no increase of the currents $I_{11}$ and $I_{12}$.

The Bi-MOS multipliers of the second and third aspects are different from the prior-art CMOS analog multiplier disclosed in the Japanese Non-Examined Patent Publication No. 60-146371 because the prior-art CMOS analog multiplier is composed of only MOSFETs.

Also, the Bi-MOS multipliers of the second and third aspects are different from both of the prior-art mixer circuit disclosed in the Japanese Non-Examined Patent Publication No. 61-105912 and the prior-art multipliers disclosed in the Japanese Non-Examined Patent Publication Nos. 3-4615 and 3-75977 because the prior-art ones are composed of only bipolar transistors, respectively.

DETAILED DESCRIPTION OF THE PREFERRED EMBODIMENTS

Preferred embodiments of the present invention will be described below referring to FIGS. 5 to 14.

[First Embodiment]

Figure 5:
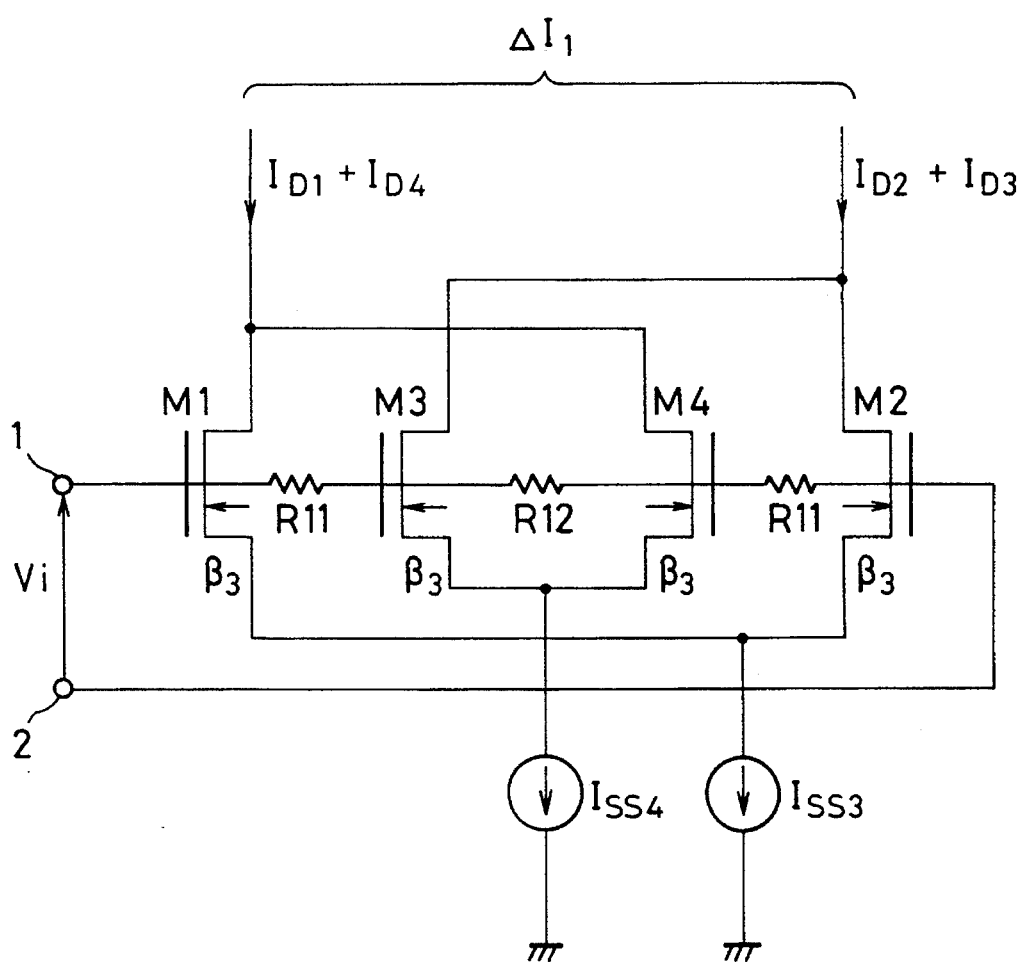
FIG. 5 is a circuit diagram of an MOSOTA according to a first embodiment of the invention.

FIG. 5 shows an MOSOTA according to a first embodiment of the invention.

As shown in FIG. 5, the MOSOTA is composed of a first balanced differential pair of n-channel MOS field-effect transistors M1 and M2 whose sources are coupled together and a second balanced differential pair of n-channel MOS field-effect transistors M3 and M4 whose sources are coupled together.

These four transistors M1, M2, M3 and M4 have the same capability i.e., transconductance parameter $\beta_3$.

The coupled sources of the first and second transistors M1 and M2 are connected to a first constant current source (current: $I_{SS3}$), so that the first balanced differential pair is driven by the first current source. Similarly, the coupled sources of the third and fourth transistors M3 and M4 are connected to a second constant current source (current: $I_{SS4}$), so that the second balanced differential pair is driven by the second current source, where $I_{SS3} \approx I_{SS4}$.

The first and second current sources are arranged between the first and second differential pairs and the ground, respectively.

Drains of the transistors M1 and M4 are coupled together and drains of the transistors M2 and M3 are coupled together. A differential output current $\Delta I_1$ of the MOSOTA is derived from the coupled drains of the transistors M1 and M4 and those of the transistors M2 and M3.

Gates of the transistors M1 and M3 are connected through a first resistor (resistance: R11) to each other. Gates of the transistors M2 and M4 are connected through a second resistor (resistance: R11) to each other. Gates of the transistors M3 and M4 are connected through a third resistor (resistance: R12) to each other.

The gate of the transistor M1 is connected to one end 1 of an input end pair and the gate of the transistor M2 is connected to the other end 2 of the input end pair. An input voltage $V_i$ is supplied to the pair of the input ends 1 and 2 to be applied directly across the gates of the transistors M1 and M2.

A voltage produced by dividing the input voltage $V_i$, i.e., $(V_i/C_1)$, is applied across the gates of the transistors M3 and M4, where $C_1$ is a constant ($C_1 > 1$).

The differential output current $\Delta I_t$ of the MOSOTA is obtained in the following manner:

Here, drain currents of the transistors M1, M2, M3 and M4 are defined as $I_{D1}$, $I_{D2}$, $I_{D3}$ and $I_{D4}$, respectively; then, the differential output current $\Delta I_1$ can be expressed as $\Delta I_1 = (I_{D1} + I_{D4}) - (I_{D2} + I_{D3})$.

The transconductance parameter $\beta_3$ is defined as $\beta_3 = \mu(C_{ox}/2)(W3/L3)$ where W3 and L3 are a gate-width and a gate-length of the transistors M1, M2, M3 and M4, respectively.

A different output current $\Delta I_1$ ($=I_{D1}-I_{D2}$) of the first balanced differential pair is expressed by the following equations (6a) and (6b) as $$\Delta I_1 = \beta_3 V_i \sqrt{\left(\frac{2I_{SS3}}{\beta_3}\right) - V_i^2} \quad \left(|V_i| \leq \sqrt{\frac{I_{SS2}}{\beta_3}}\right) \quad (6a)$$

$$\Delta I_2 = I_{SS2} S_{gn}(V_i) \quad \left(|V_i| \geq \sqrt{\frac{I_{SS3}}{\beta_3}}\right) \quad (6b)$$

Similarly, a differential output current $\Delta I_2$ ($=I_{D4}-I_{D3}$) of the second balanced differential pair is expressed by the following equations (7a) and (7b) as $$\Delta I_2 = \frac{\beta_3 V_i}{C} \cdot \sqrt{\left\{\left(\frac{2I_{SS4}}{\beta_3}\right) - \frac{V_i^2}{C^2}\right\}} \quad \left(|V_i| \leq \sqrt{\frac{I_{SS4}}{\beta_3}}\right) \quad (7a)$$

$$\Delta I_2 = I_{SS4} S_{gn}(V_i) \quad \left(|V_i| \geq \sqrt{\frac{I_{SS2}}{\beta_3}}\right) \quad (7b)$$

The constant, i.e., divide ratio $C_1$ has the following relationship with the resistances R11 and R12 as $$\frac{1}{C_1} = \frac{R2}{(2R1 + R2)} \quad (C_1 > 1) \quad (8)$$

Therefore, compared with the equations (2a) and (7a) under the condition of $\beta_3 = \beta_2$, it is seen that these equations (2a) and (7a) are in accordance with each other if the following relationship (9) is established.

$$C_1 = \frac{1}{\sqrt{(\beta_2/\beta_1)}} \quad (9)$$

Figure 1:
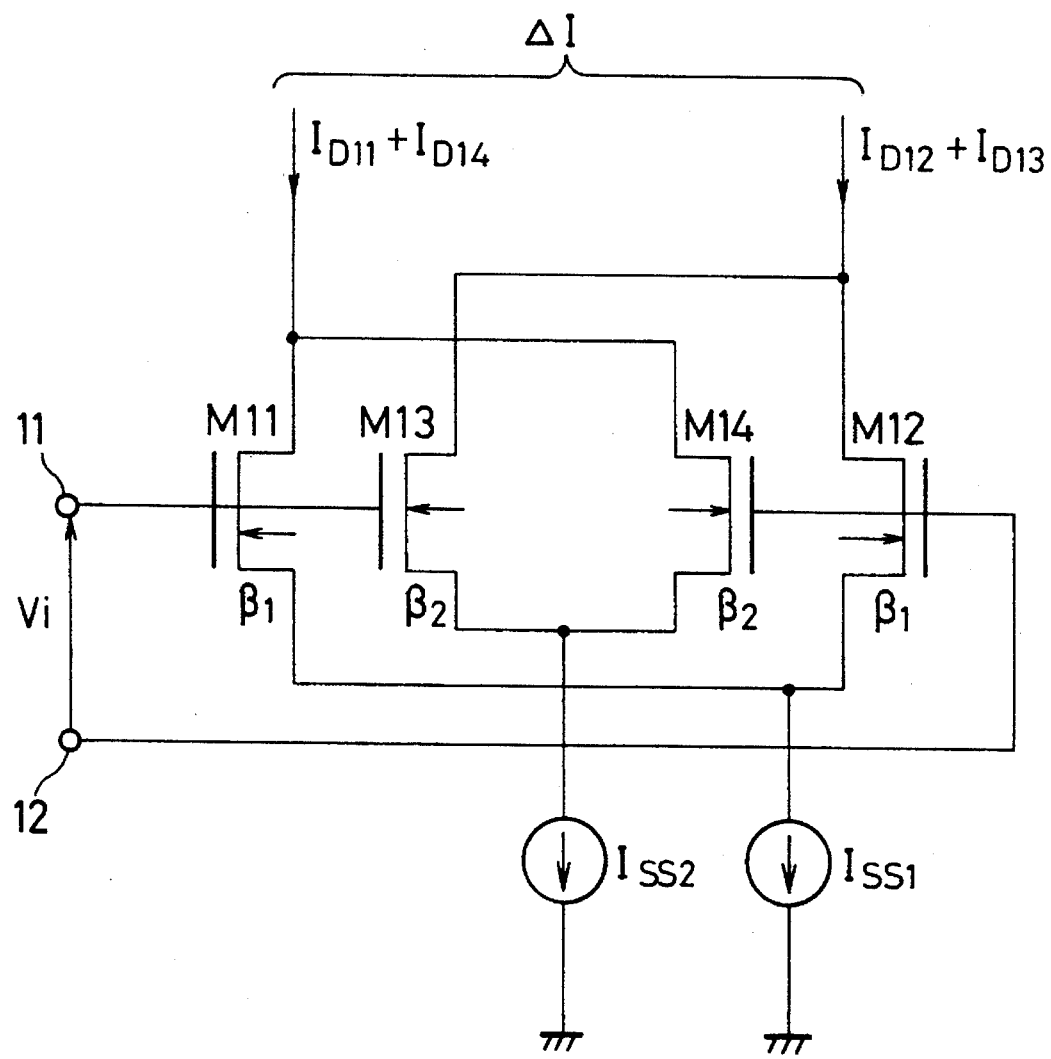
FIG. 1 is a circuit diagram showing a conventional MOSOTA.
Figure 2:
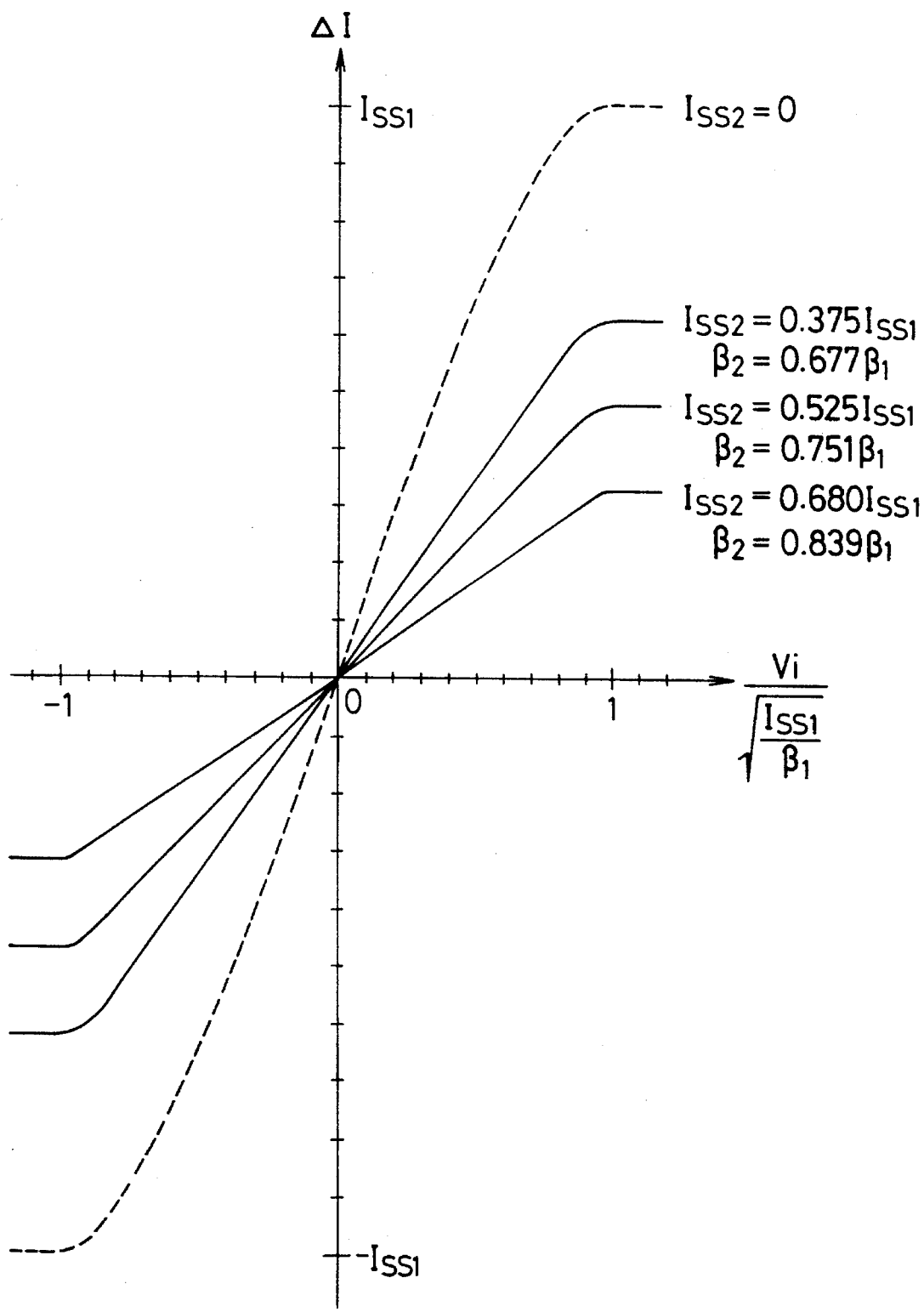
FIG. 2 is a graph showing the input-output characteristic of the conventional MOSOTA shown in FIG. 1.
Figure 3:
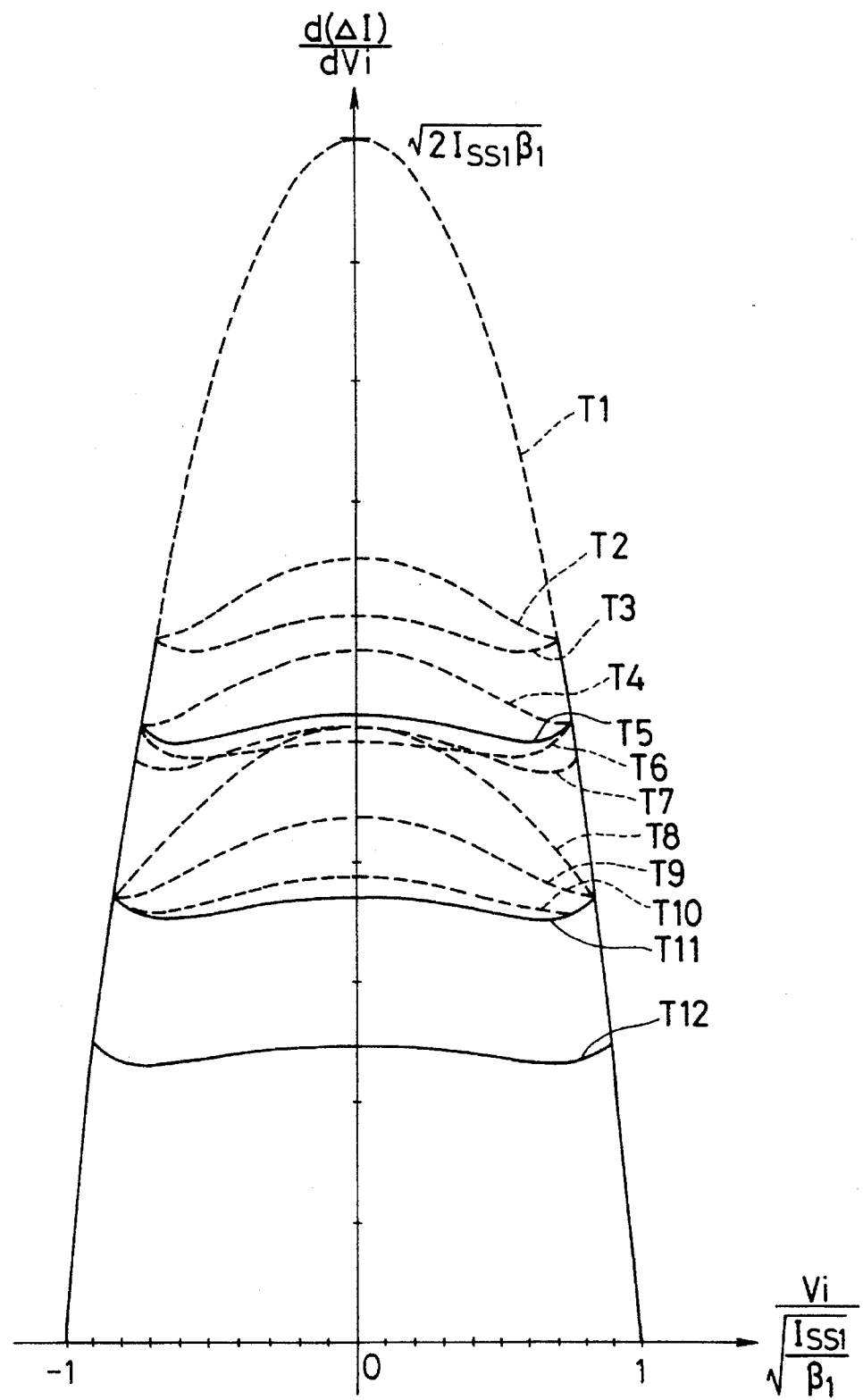
FIG. 3 is a graph showing the transconductance characteristic of the conventional MOSOTA shown in FIG. 1.

If the divide ratio $C_1$, or the resistances R11 and R12 are decided so that the relationship (9) is established, the circuit configuration shown in FIG. 5 becomes equivalent to that shown in FIG. 1, which provides the same input-output characteristic shown in FIG. 2 and the same transconductance characteristic shown in FIG. 3 as those of the conventional one.

The first, second and third resistors may be made of patterned polysilicon films, respectively. In general, resistors made of the patterned polysilicon films do not increase the distortion of the input signal passing through the resistors if the resistors are produced through popular fabrication process steps. Additionally, such polysilicon resistors do not enlarge the chip areas of the transistors M1, M2, M3 and M4.

Also, almost voluntary values of the resistance R11 and R12 can be realized because the values will be decided by the minimum measurement or size of a mask used in their fabrication process step.

Further, since the constant $C_1$ is expressed by a ratio of the resistances R11 and R12 as shown in the equation (8), obtainable value of $C_1$ is small in fluctuation due to the fabrication processes.

As described above, with the MOSOTA of the first embodiment, the applied voltage to the input ends of the MOS transistors M3 and M4 changes according to the value of the divide ratio $C_1$. As a result, a difference between the transconductance parameters of the first balanced differential pair and that of the second balanced differential pair is substantially generated, which is equivalent to the circuit configuration of the conventional one shown in FIG. 1.

Accordingly, an equivalent input-output characteristic and an equivalent transconductance characteristic to those of the conventional one in FIG. 1 can be obtained.

Because the MOS transistors M1, M2, M3 and M4 has the same transconductance parameter $\beta_3$, the MOSOTA can be realized by common-sized transistors without increase in chip area.

[Second Embodiment]

Figure 6:
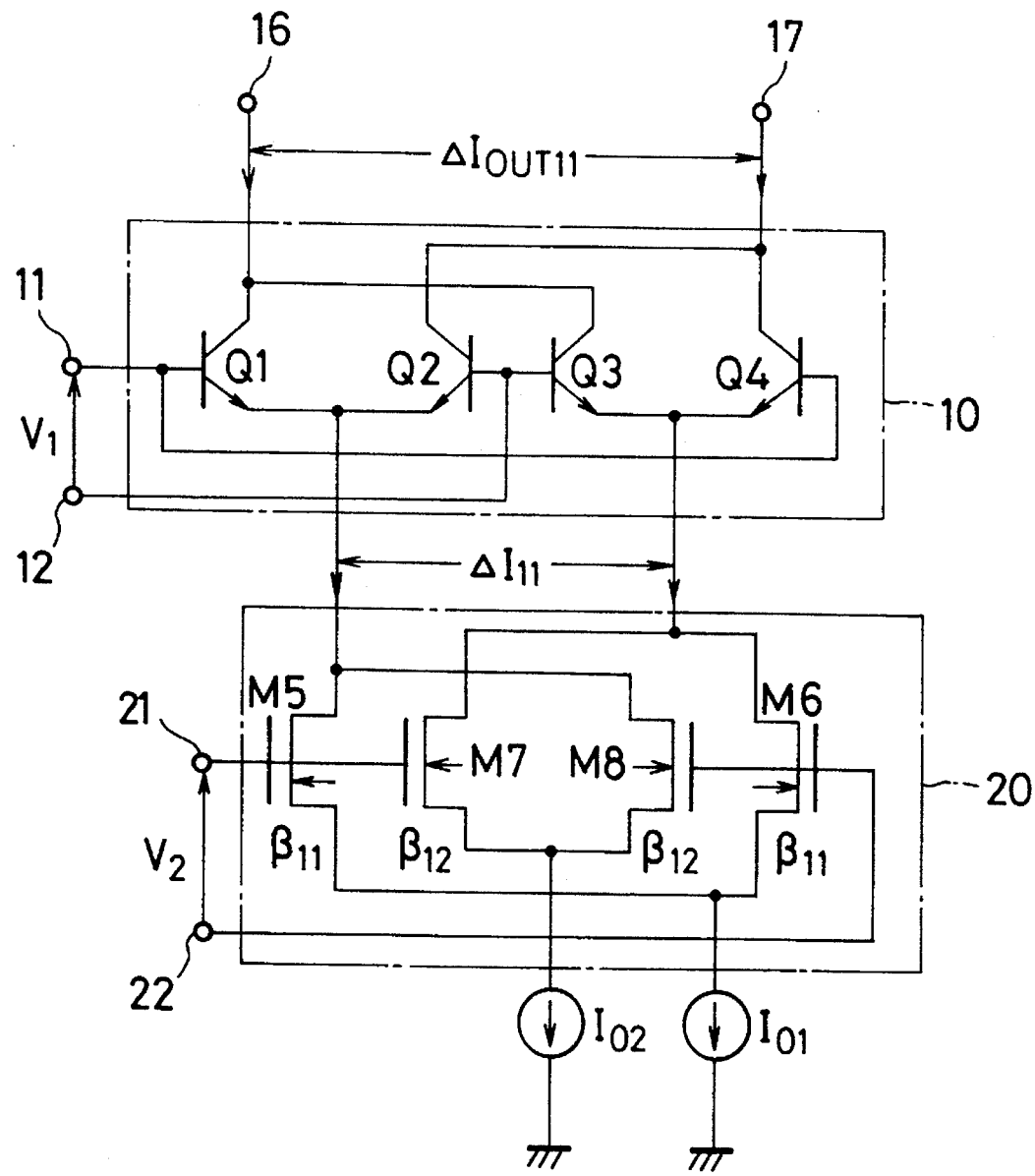
FIG. 6 is a circuit diagram of a Bi-MOS multiplier according to a second embodiment of the invention.

FIG. 6 shows a Bi-MOS multiplier according to a second embodiment of the invention.

The Bi-MOS multiplier of the second embodiment contains cross-coupled, emitter-coupled pairs 10 applied with a first input voltage $V_1$ and cross-coupled, source-coupled pairs 20 applied with a second input voltage $V_2$. The cross-coupled, emitter-coupled pairs 10 are driven by a differential output current $\Delta I_{11}$ of the cross-coupled, source-coupled pairs 20.

The cross-coupled, emitter-coupled pairs 10 are composed of a first differential pair of npn bipolar transistors Q1 and Q2 whose emitters are coupled together and a second differential pair of npn bipolar transistors Q3 and Q4 whose emitters are coupled together.

Collectors of the bipolar transistors Q1 and Q3 are coupled together to be connected to one end 16 of an output end pair. Also, collectors of the bipolar transistors Q2 and Q4 are coupled together to be connected to the other end 17 of the output end pair. A differential output current $\Delta I_{OUT11}$ of the multiplier is derived from the pair of the output ends 16 and 17.

Bases of the transistors Q1 and Q4 are coupled together to be connected to one end 11 of a first input end pair. Bases of the transistors Q2 and Q3 are coupled together to be connected to the other end 12 of the first input end pair. The first input voltage $V_1$ is applied across the first input end pair 11 and 12.

Figure 4:
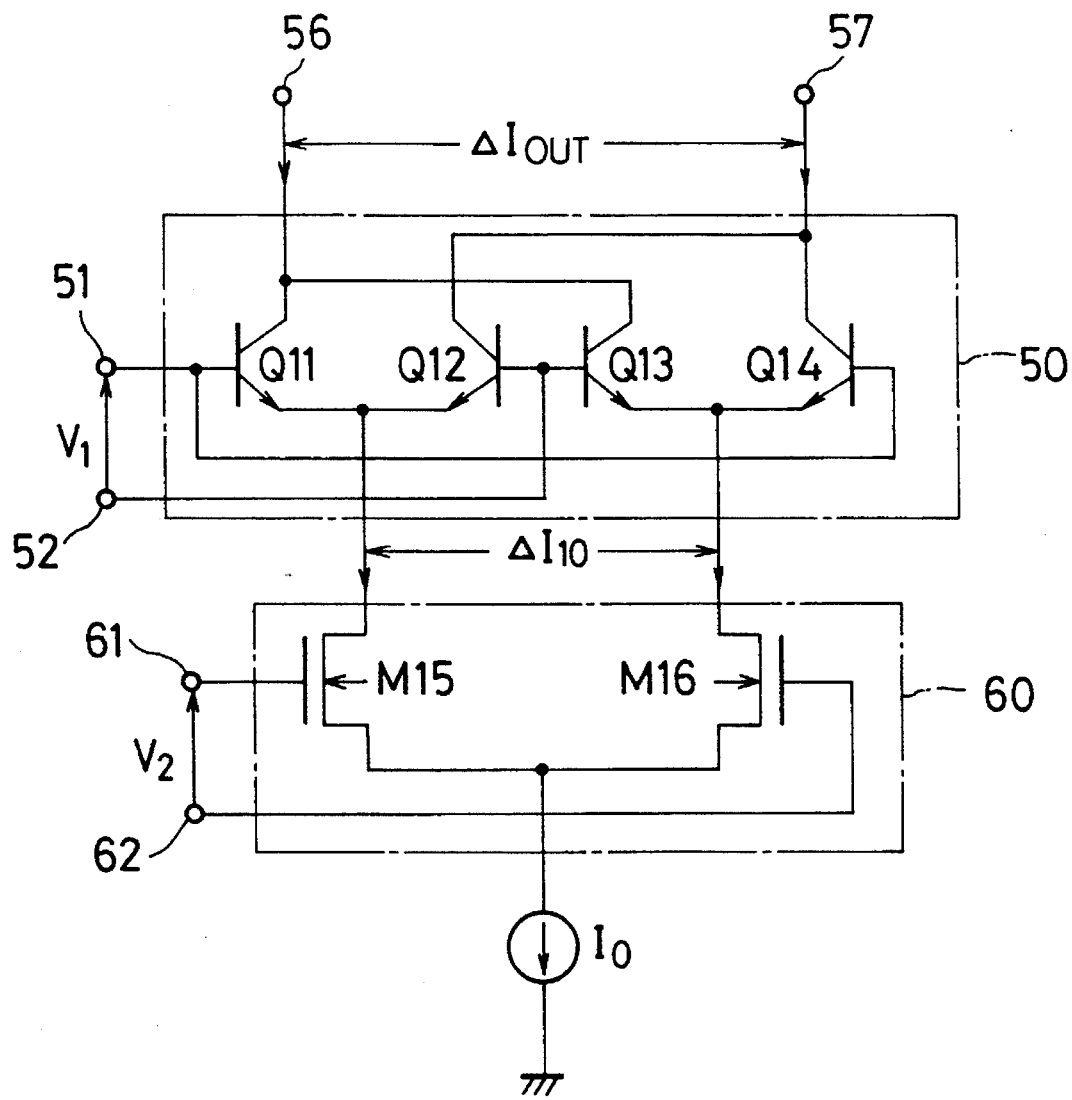
FIG. 4 is a circuit diagram showing a conventional Bi-MOS multiplier.

The cross-coupled, emitter-coupled pairs 10 described above are substantially the same in configuration as the cross-coupled, emitter-coupled pairs 50 of the conventional Bi-MOS multiplier shown in FIG. 4.

The cross-coupled, source-coupled pairs 20 are composed of a third balanced differential pair of n-channel MOS field-effect transistors M5 and M6 whose sources are coupled together, and a fourth balanced differential pair of n-channel MOS field-effect transistors M7 and M8 whose sources are coupled together.

The MOS transistors M5 and M6 have the same transconductance parameter $\beta_{11}$ and the MOS transistors M7 and M8 have the same transconductance parameter $\beta_{12}$ where $\beta_{11} \neq \beta_{12}$.

The coupled sources of the MOS transistors M5 and M6 are connected to a first constant current source whose constant current is $I_{01}$. The coupled sources of the MOS transistors M7 and M8 are connected to a second constant current source whose constant current is $I_{02}$. The first and second current sources are arranged between the third and fourth differential pairs and the ground.

Drains of the MOS transistors M5 and M8 are coupled together to be connected to the coupled emitters of the bipolar transistors Q1 and Q2. Drains of the MOS transistors M6 and M7 are coupled together to be connected to the coupled emitters of the bipolar transistors Q3 and Q4.

The differential output current $\Delta I_{11}$ of the cross-coupled, source-coupled pairs 20 are outputted from the coupled drains of the MOS transistors M5 and M8 and the coupled drains of the MOS transistors M6 and M7.

Gates of the MOS transistors M5 and M7 are coupled together to be connected to one end 21 of a second input end pair. Gates of the transistors M6 and M8 are coupled together to be connected to the other end 22 of the second input end pair. The second input voltage $V_2$ is applied across the second pair of the input ends 21 and 22.

The differential output current $\Delta I_{11}$ of the cross-coupled, source-coupled pairs 20 are, if the input voltage range of $V_2$ is limited, expressed by the following equation (10) as $$\Delta I = \beta_{11}\left(V_2\sqrt{\frac{2I_{01}}{\beta_{11}} - V_2^2}\right) - \beta_{12}\left(V_2\sqrt{\frac{2I_{02}}{\beta_{12}} - V_2^2}\right) \quad (10)$$

The equation (10) can be approximated by the following equation (11) as $$\Delta I \approx V_2\left[\sqrt{2\beta_{11}I_{01}} \cdot \left\{1 - \left(1 - \frac{1}{\sqrt{2}}\right) \cdot \left(\frac{\beta_{11}}{I_{01}}\right) \cdot V_2^2\right\} - \sqrt{2\beta_{12}I_{02}} \cdot \left\{1 - \left(1 - \frac{1}{\sqrt{2}}\right) \cdot \left(\frac{\beta_{12}}{I_{02}}\right) \cdot V_2^2\right\}\right] \quad (11)$$

$$\left(|V_2| \leq \sqrt{\frac{I_{0i}}{\beta_{1i}}}, i = 1, 2\right)$$

The equation (11) provides a superior approximation of the equation (10) due to its small error.

To make the differential output current $\Delta I_{11}$ linear relative to the second input voltage $V_2$, it is seen from the equation (11) that the following relationship (12) needs to be satisfied.

$$\left(\frac{\beta_{11}}{\beta_{12}}\right)^{3/2} = \sqrt{\frac{I_{01}}{I_{02}}} \quad (12)$$

The MOS transistors M5 and M6 with the same transconductance parameter $\beta_{11}$ have the same ratio $(W/L)_1$ of their gate-widths W and gate-lengths L. Similarly, the MOS transistors M7 and M8 with the same transconductance parameter $\beta_{12}$ have the same ratio $(W/L)_2$ of their gate-widths W and gate-lengths L. Further, the transconductance parameter ratio $(\beta_{11}/\beta_{12})$ can be expressed using the ratios $(W/L)_1$ and $(W/L)_2$.

Therefore, the relationship (12) can be rewritten as $$\left(\frac{(W/L)_1}{(W/L)_2}\right)^{3/2} = \sqrt{\frac{I_{01}}{I_{02}}} \quad (13)$$

Accordingly, if the driving currents $I_{01}$ and $I_{03}$ of the first and second constant current sources and the transconductance parameters $\beta_{11}$ and $\beta_{12}$ of the MOS transistors M5, M6, M7 and M8 have the above relationship (12) or (13), the differential output current $\Delta I_{11}$ can be improved in linearity.

Figure 7:
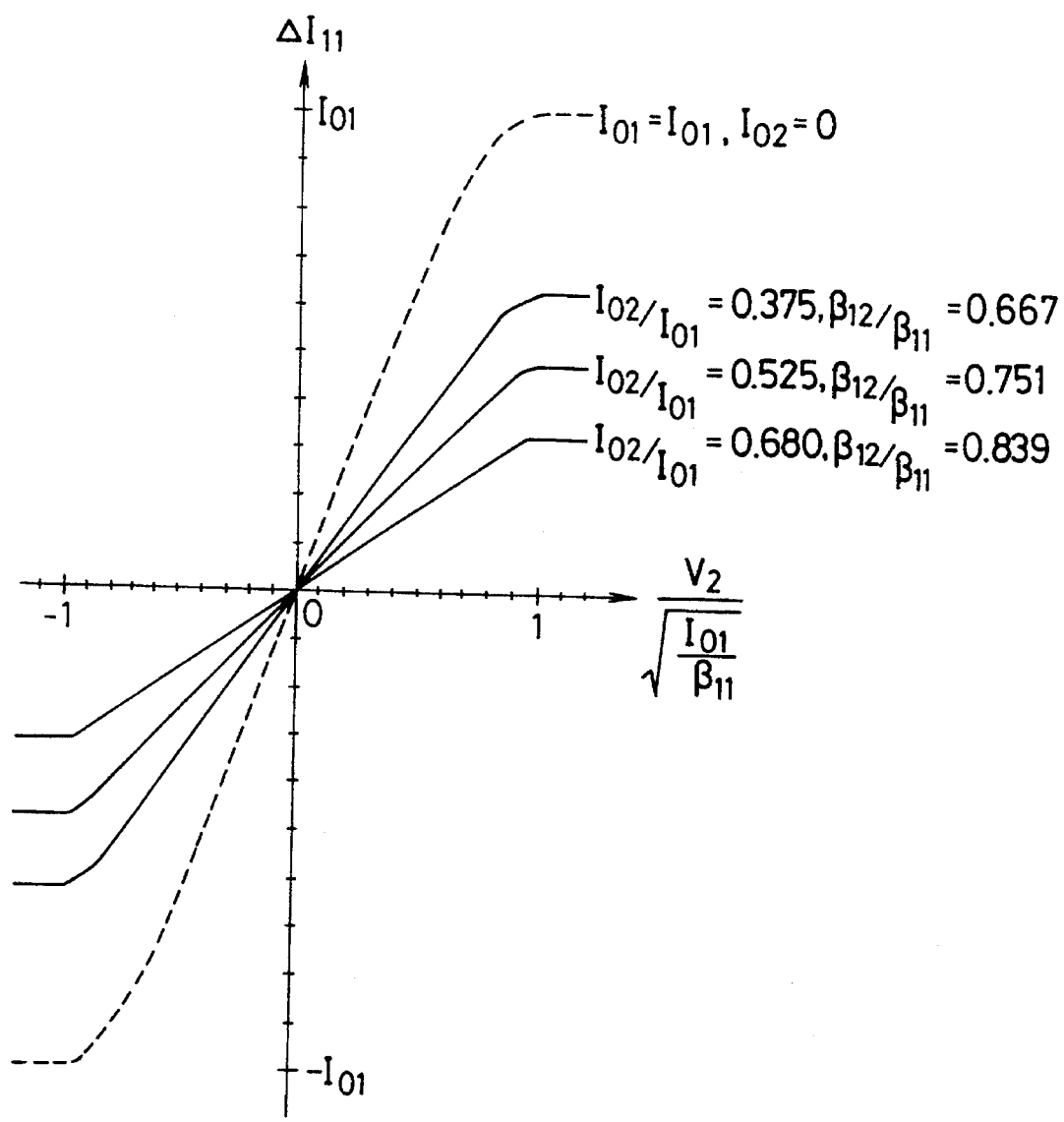
FIG. 7 is a graph showing the input-output characteristic of the Bi-MOS multiplier shown in FIG. 6.

FIG. 7 shows the input-output characteristic of the Bi-MOS multiplier of the second embodiment satisfying the above relationship (12) or (13). It is seen from FIG. 7 that the differential output current $\Delta I_{11}$ is linear within a relatively wide range of the second input voltage $V_2$.

Since the cross-coupled, emitter-coupled pairs 10 are driven by the differential output current $\Delta I_{11}$ thus improved in linearity, a wider input voltage range can be obtained than the conventional one shown in FIG. 4 with no increase of the driving currents $I_{01}$ and $I_{02}$.

In the second embodiment, the transconductance parameters $\beta_{11}$ and $\beta_{12}$, in other words, the ratios $(W/L)_1$ and (W/L)$_2$ of the gate-widths W and gate-lengths L, are different from each other. However, the transconductance parameters $\beta_{11}$ and $\beta_{12}$, or the ratios (W/L)$_1$ and (W/L)$_2$ may be the same as each other.

[Third Embodiment]

Figure 8:
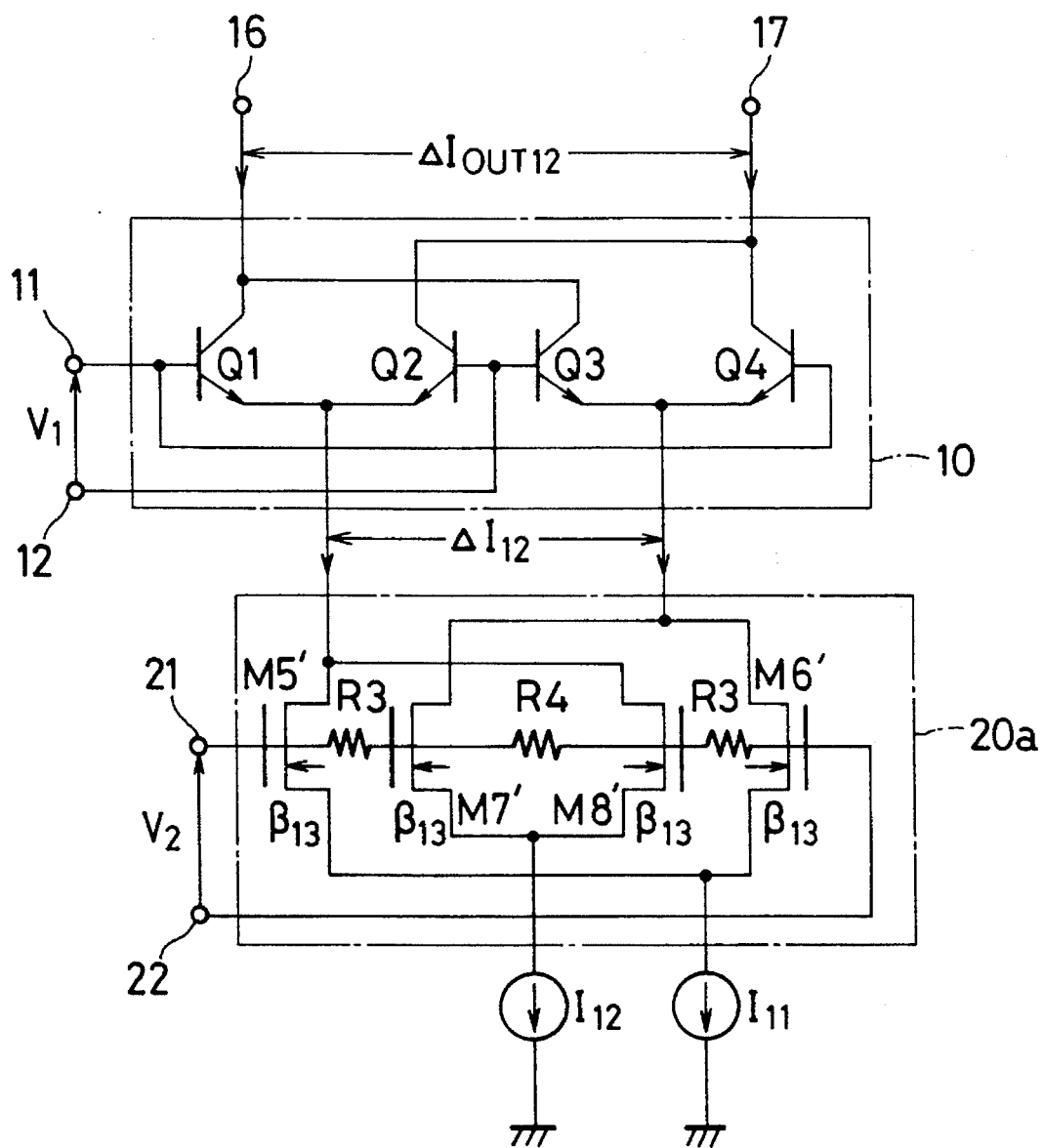
FIG. 8 is a circuit diagram of a Bi-MOS multiplier according to a third embodiment of the invention.

FIG. 8 shows a Bi-MOS multiplier according to a third embodiment of the invention.

Similar to the second embodiment, the Bi-MOS multiplier of the third embodiment contains cross-coupled, emitter-coupled pairs 10 applied with a first input voltage $V_1$ and cross-coupled, source-coupled pairs 20a applied with a second input voltage $V_2$. The cross-coupled, emitter-coupled pairs 10 are driven by a differential output current $\Delta I_{12}$ of the cross-coupled, source-coupled pairs 20a.

The cross-coupled, emitter-coupled pairs 10 are the same in configuration as those of the second embodiment, so that the description thereof is omitted here.

The cross-coupled, source-coupled pairs 20a are composed of a third balanced differential pair of n-channel MOS field-effect transistors M5' and M6' whose sources are coupled together, and a fourth balanced differential pair of n-channel MOS field-effect transistors M7' and M8' whose sources are coupled together.

The MOS transistors M5', M6', M7' and M8' have the same transconductance parameter $\beta_{13}$.

The coupled sources of the MOS transistors M5' and M6' are connected to a first constant current source whose constant current is $I_{11}$. The coupled sources of the MOS transistors M7' and M8' are connected to a second constant current source whose constant current is $I_{12}$. The first and second current sources are arranged between the third and fourth differential pairs and the ground, respectively.

Drains of the MOS transistors M5' and M8' are coupled together to be connected to the coupled emitters of the bipolar transistors Q1 and Q2. Drains of the MOS transistors M6' and M7' are coupled together to be connected to the coupled emitters of the bipolar transistors Q3 and Q4.

The differential output current $\Delta I_{12}$ of the cross-coupled, source=coupled pairs 20a is outputted from the coupled drains of the MOS transistors M5' and M8' and the coupled drains of the MOS transistors M6' and M7'.

Gates of the MOS transistors M5' and M7' are coupled together through a first resistor (resistance: R3) to each other. Gates of the MOS transistors M6' and M8' are coupled together through a second resistor (resistance: R3) to each other. Gates of the MOS transistors M7' and M8' are coupled together through a third resistor (resistance: R4) to each other where R3≠R4.

The gate of the MOS transistor M5' is connected to one end 21 of a second input end pair and the gate of the MOS transistor M6' is connected to the other end 22 of the second input end pair. A second input voltage $V_2$ is supplied to the second pair of the input ends 21 and 22 to be applied directly across the gates of the MOS transistors M5' and M6'.

A voltage produced by dividing the second input voltage $V_2$ i.e., ($V_2/C_2$) is applied across the gates of the MOS transistors M7' and M8', where $C_2$ is a divide ratio ($C_2>1$).

The divide ratio $C_2$ can be expressed by the following equation (11) as $$C_2 = \frac{R4}{(2R3 + R4)} \quad (11)$$

The differential output current $\Delta I_{12}$ of the cross-coupled, source-coupled pairs 20a is, if the input voltage range of $V_2$ is limited, expressed by the following equation (12) as $$\Delta I = \beta_{13}\left(V_2\sqrt{\frac{2I_{11}}{\beta_{13}} - V_2^2}\right) - \beta_{13}\left(\frac{V_2}{C_2}\sqrt{\frac{2I_{12}}{\beta_{13}} - \left(\frac{V_2}{C_2}\right)^2}\right) \quad (12)$$

The equation (12) can be approximated by the following equation (13) as $$\Delta I_{12} \approx V_2\left[\left(\sqrt{2\beta_{13}I_{11}} \cdot \left\{1 - \left(1 - \frac{1}{\sqrt{2}}\right) \cdot \left(\frac{\beta_{13}}{I_{11}}\right) \cdot V_2^2\right\}\right) - \frac{1}{C2}\sqrt{2\beta_{13}I_{12}} \cdot \left\{1 - \left(1 - \frac{1}{\sqrt{2}}\right) \cdot \left(\frac{\beta_{13}}{I_{12}}\right) \cdot \left(\frac{V_2}{C_2}\right)^2\right\}\right] \quad (13)$$

$$\left(|V_2| \leq \sqrt{\frac{I_{1i}}{\beta_{13}}}, i = 1, 2\right)$$

To make the differential output current $\Delta I_{12}$ linear relative to the second input voltage $V_2$, it is seen from the equation (13) that the following relationship (14) needs to be satisfied.

$$C_2^3 = \sqrt{\frac{I_{11}}{I_{12}}} \quad (14)$$

Therefore, the third embodiment has an equivalent circuit configuration to that of the second embodiment, if the divide ratio $C_2$ satisfies the above relationship (14) and the transconductance parameter ratio ($\beta_{11}/\beta_{12}$) in the second embodiment shown in FIG. 6 have the following relationship (15) as $$C_2 = \sqrt{\frac{\beta_{11}}{\beta_{12}}} \quad (15)$$

This means that the Bi-MOS multiplier of the third embodiment has the same effect or advantage as that of the second embodiment.

[Fourth Embodiment]

Figure 9:
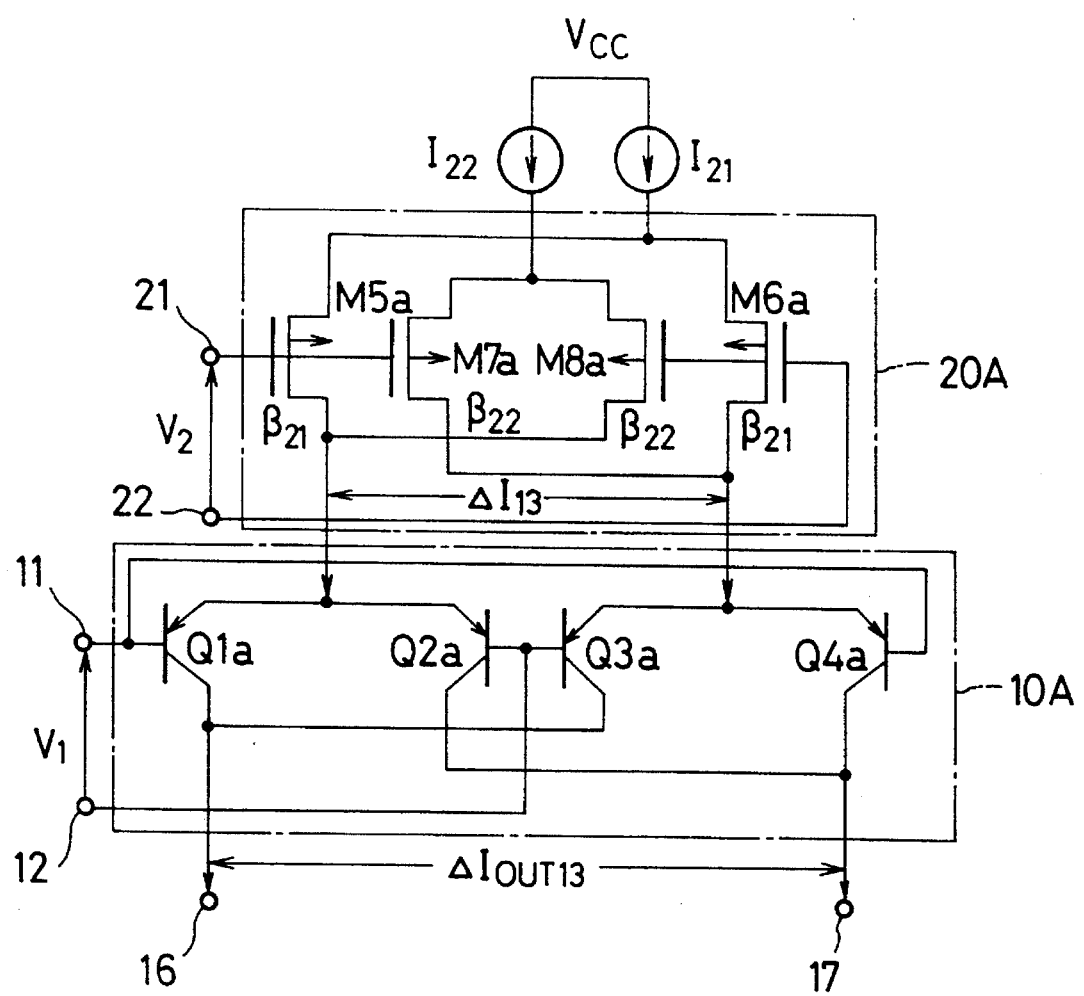
FIG. 9 is a circuit diagram of a Bi-MOS multiplier according to a fourth embodiment of the invention.

FIG. 9 shows a Bi-MOS multiplier according to a fourth embodiment of the invention, which is substantially the same in configuration as that of the second embodiment in FIG. 6 other than that the conductivity types of the respective transistors used therein are opposite to each other.

In detail, the Bi-MOS multiplier of the fourth embodiment contains cross-coupled, emitter-coupled pairs 10A applied with a first input voltage $V_1$ and cross-coupled, source-coupled pairs 20A applied with a second input voltage $V_2$. The cross-coupled, emitter-coupled pairs 10A are driven by a differential output current $\Delta I_{13}$ of the cross-coupled, source-coupled pairs 20A.

The cross-coupled, emitter-coupled pairs 10A are composed of a first differential pair of pnp bipolar transistors Q1a and Q2a whose emitters are coupled together and a second differential pair of pnp bipolar transistors Q3a and Q4a whose emitters are coupled together.

Collectors of the bipolar transistors Q1a and Q3a are coupled together to one end 16 of the output end pair. Also, collectors of the bipolar transistors Q2a and Q4a are coupled together to be connected to the other end 17 of the output end pair. A differential output current $\Delta I_{OUT13}$ of the multiplier is derived from the output pair of the ends 16 and 17.

Bases of the transistors Q1a and Q4a are coupled together to be connected to one end 11 of a first input end pair. Bases of the transistors Q2a and Q3a are coupled together to be connected to the other end 12 of the first input end pair. The first input voltage $V_1$ is applied across the first input pair of the ends 11 and 12.

The cross-coupled, source-coupled pairs 20A are composed of a third balanced differential pair of p-channel MOS field-effect transistors M5a and M6a whose sources are coupled together, and a fourth balanced differential pair of p-channel MOS field-effect transistors M7a and M8a whose sources are coupled together.

The MOS transistors M5a and M6a have the same transconductance parameter $\beta_{21}$ and the MOS transistors M7a and M8a have the same transconductance parameter $\beta_{22}$, where $\beta_{21} \neq \beta_{22}$.

The coupled sources of the MOS transistors M5a and M6a are connected to a first constant current source whose constant current is $I_{21}$. The coupled sources of the MOS transistors M7a and M8a are connected to a second constant current source shoe constant current is $I_{22}$. The first and second current sources are arranged between the third and fourth differential pairs and a constant voltage source (voltage: $V_{CC}$).

Drains of the MOS transistors M5a and M8a are coupled together to be connected to the coupled emitters of the bipolar transistors Q1a and Q2a. Drains of the MOS transistors M6a and M7a are coupled together to be connected to the coupled emitters of the bipolar transistors Q3a and Q4a.

Gates of the MOS transistors M5a and M7a are coupled together to be connected to one end 21 of a second input end pair. Gates of the transistors M6a and M8a are coupled together to be connected to the other end 22 of the second input end pair. The second input voltage $V_2$ is applied across the second input end pair 21 and 22.

If the driving currents $I_{21}$ and $I_{22}$ of the first and second constant current sources and the transconductance parameters $\beta_{21}$ and $\beta_{22}$ of the MOS transistors M5a, M6a, M7a and M8a have such a relationship as the above expression (12) or (13), the differential output current $\Delta I_{13}$ of the cross-coupled, source-coupled pairs 20A can be improved in linearity.

Therefore, similar to the second embodiment, a wider input voltage range of $V_2$ can be obtained than the conventional one shown in FIG. 4 with no increase of the driving currents $I_{21}$ and $I_{22}$.

[Fifth Embodiment]

Figure 10:
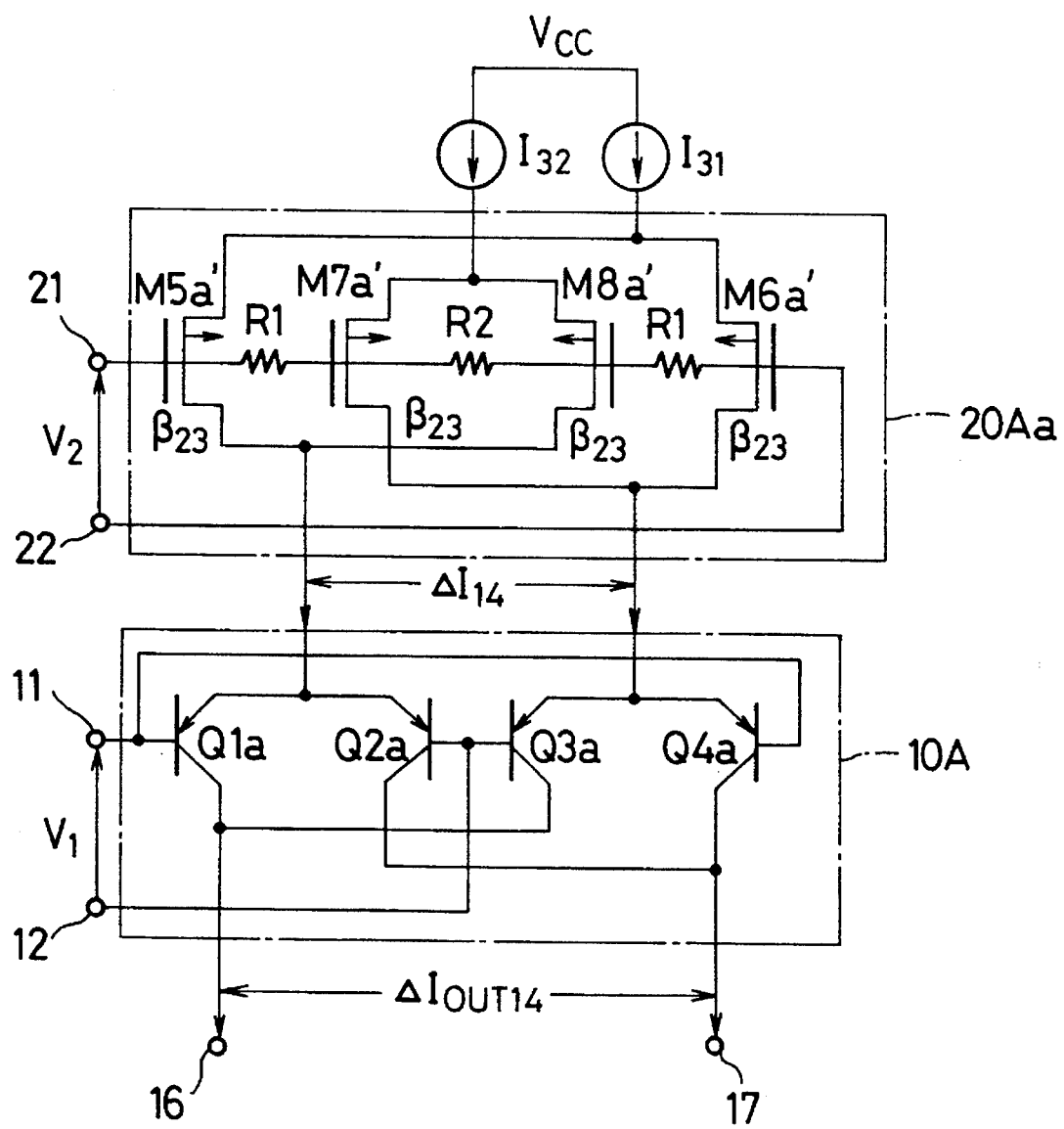
FIG. 10 is a circuit diagram of a Bi-MOS multiplier according to a fifth embodiment of the invention.

FIG. 10 shows a Bi-MOS multiplier according to a fifth embodiment of the invention, which is substantially the same in configuration as that of the third embodiment in FIG. 8 other than that the conductivity types of the respective transistors used therein are opposite to each other.

In detail, similar to the third embodiment, the Bi-MOS multiplier of the fifth embodiment contains the cross-coupled, emitter-coupled pairs 10A applied with a first input voltage $V_1$, which are the same in configuration as those shown in FIG. 9, and cross-coupled, source-coupled pairs 20Aa applied with a second input voltage $V_2$. The cross-coupled, emitter-coupled pairs 10A are driven by a differential output current $\Delta I_{14}$ of the cross-coupled, source-coupled pairs 20Aa.

The cross-coupled, source-coupled pair 20Aa is composed of a third balanced differential pair of p-channel MOS field-effect transistors M5a' and M6a' whose sources are coupled together, and a fourth balanced differential pair of p-channel MOS field-effect transistors M7a' and M8a' whose sources are coupled together.

The MOS transistors M5a', M6a', M7a' and M8a' have the same transconductance parameter $\beta_{23}$.

The coupled sources of the MOS transistors M5a' and M6a' are connected to a first constant current source whose constant current is $I_{31}$. The coupled sources of the MOS transistors M7a' and M8a' are connected to a second constant current source whose constant current is $I_{32}$. The first and second current sources are arranged between the third and fourth differential pairs and a constant voltage source (voltage: $V_{CC}$).

Drains of the MOS transistors M5a' and M8a' are coupled together to be connected to the coupled emitters of the bipolar transistors Q1a and Q2a. Drains of the MOS transistors M6a' and M7a' are coupled together to be connected to the coupled emitters of the bipolar transistors Q3a and Q4a.

The differential output current $\Delta I_{14}$ of the cross-coupled, source-coupled pairs 20Aa is outputted from the coupled drains of the MOS transistors M5a' and M8a' and the coupled drains of the MOS transistors M6a' and M7a'.

Gates of the MOS transistors M5a' and M7a' are coupled together through a first resistor (resistance: R1) to each other. Gates of the MOS transistors M6a' and M8a' are coupled together through a second resistor (resistance: R1) to each other. Gates of the MOS transistors M7a' and M8a' are coupled together through a third resistor (resistance: R2) to each other where R1≠R2.

The gate of the MOS transistor M5a' is connected to one end 21 of a second input end pair and the gate of the MOS transistor M6a' is connected to the other end 22 of the second input end pair. A second input voltage $V_2$ is supplied to the second input end pair 21 and 22 to be applied directly across the gates of the MOS transistors M5a' and M6a'.

If the driving currents $I_{31}$ and $I_{32}$ of the first and second constant current sources and the transconductance parameter $\beta_{23}$ of the MOS transistors M5a', M6a', M7a' and M8a' have such a relationship as the above expression (12) or (13), the differential output current $\Delta I_{14}$ of the cross-coupled, source-coupled pairs 20Aa can be improved in linearity. Therefore, similar to the third embodiment, a winder input voltage range of $V_3$ can be obtained than the conventional one shown in FIG. 4 with no increase of the driving currents $I_{31}$ and $I_{32}$.

[Sixth Embodiment]

Figure 11:
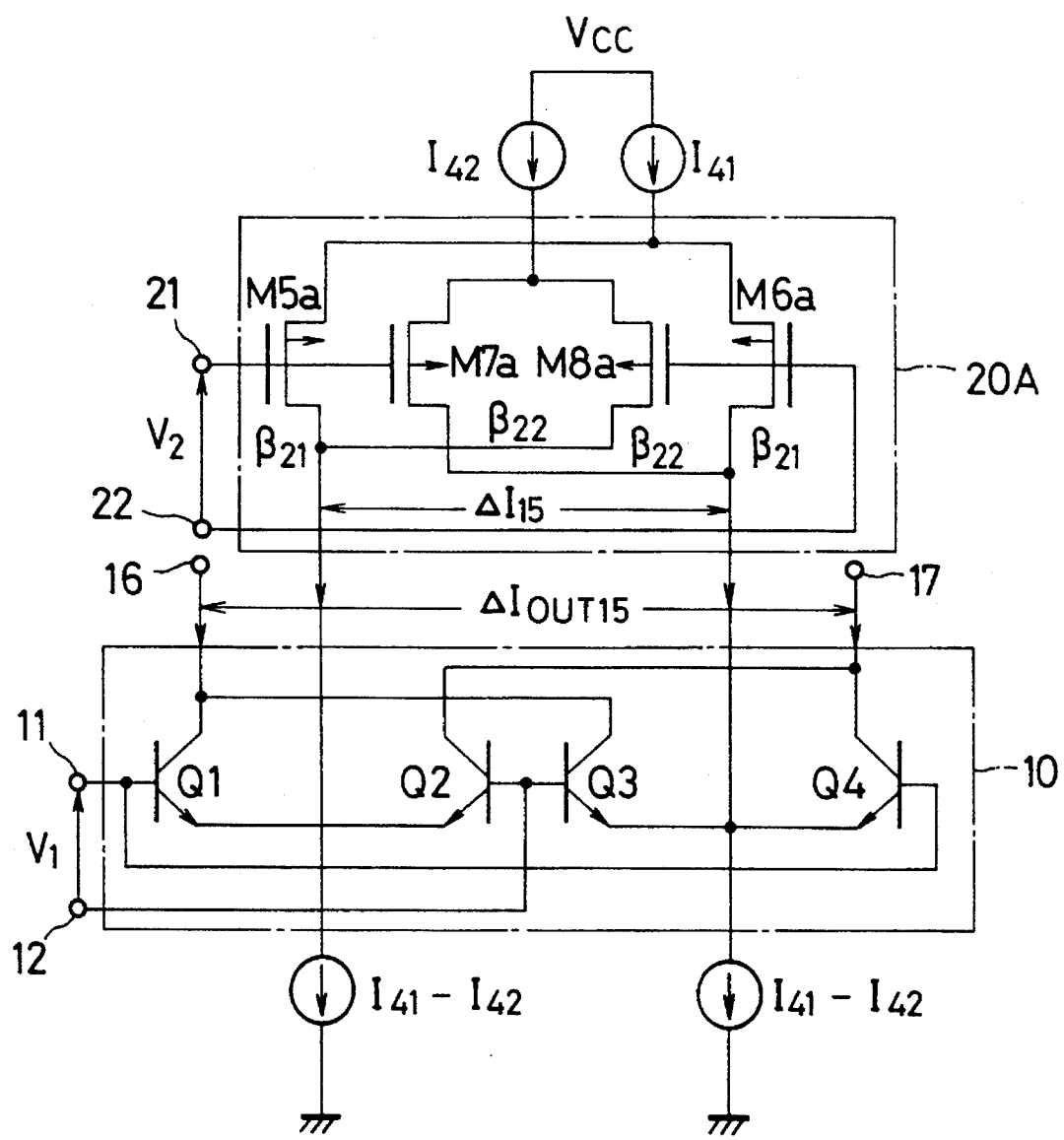
FIG. 11 is a circuit diagram of a Bi-MOS multiplier according to a sixth embodiment of the invention.

FIG. 11 shows a Bi-MOS multiplier according to a sixth embodiment of the invention, which is equivalent to a combination of the cross-coupled, emitter-coupled pairs 10 shown in FIG. 6 and the cross-coupled, source-coupled pairs 20A shown in FIG. 9.

As shown in FIG. 11, a first constant current source (current: $I_{41}$) is connected to the coupled sources of the MOS transistors M5a and M6a and a second constant current source (current: $I_{42}$) is connected to the coupled sources of the MOS transistors M7a and M8a. The first current source is disposed between the third differential pair of the MOS transistors M5a and M6a and a constant voltage source (voltage: $V_{CC}$). The second constant current source is disposed between the fourth differential pair of the MOS transistors M7a and M8a and the constant voltage source.

Additionally, in the sixth embodiment, there is a third constant current source (current: $I_{41}-I_{42}$) between the coupled emitters of the transistors Q1 and Q2 and the ground. Also, there is a fourth constant current source (current: $I_{41}-I_{42}$) between the coupled emitters of the transistors Q3 and Q4 and the ground.

A differential output current $\Delta I_{15}$ of the cross-coupled, source-coupled pairs 20A is derived from the coupled drains of the transistors M5a and M8a and those of the transistors M6a and M7a.

A differential output current $\Delta I_{OUT15}$ of the multiplier is derived from the pair of the output ends 16 and 17.

Because the multiplier of the sixth embodiment is substantially the same in configuration as that of the second embodiment in FIG. 6, the same effect or advantage as that of the second embodiment can be obtained.

Further, there is an additional advantage that the multiplier of the sixth embodiment can operate a lower supply voltage than that of the second embodiment. However, there arises a disadvantage that the total current of the multiplier becomes about three times as much as that of the second embodiment.

[Seventh Embodiment]

Figure 12:
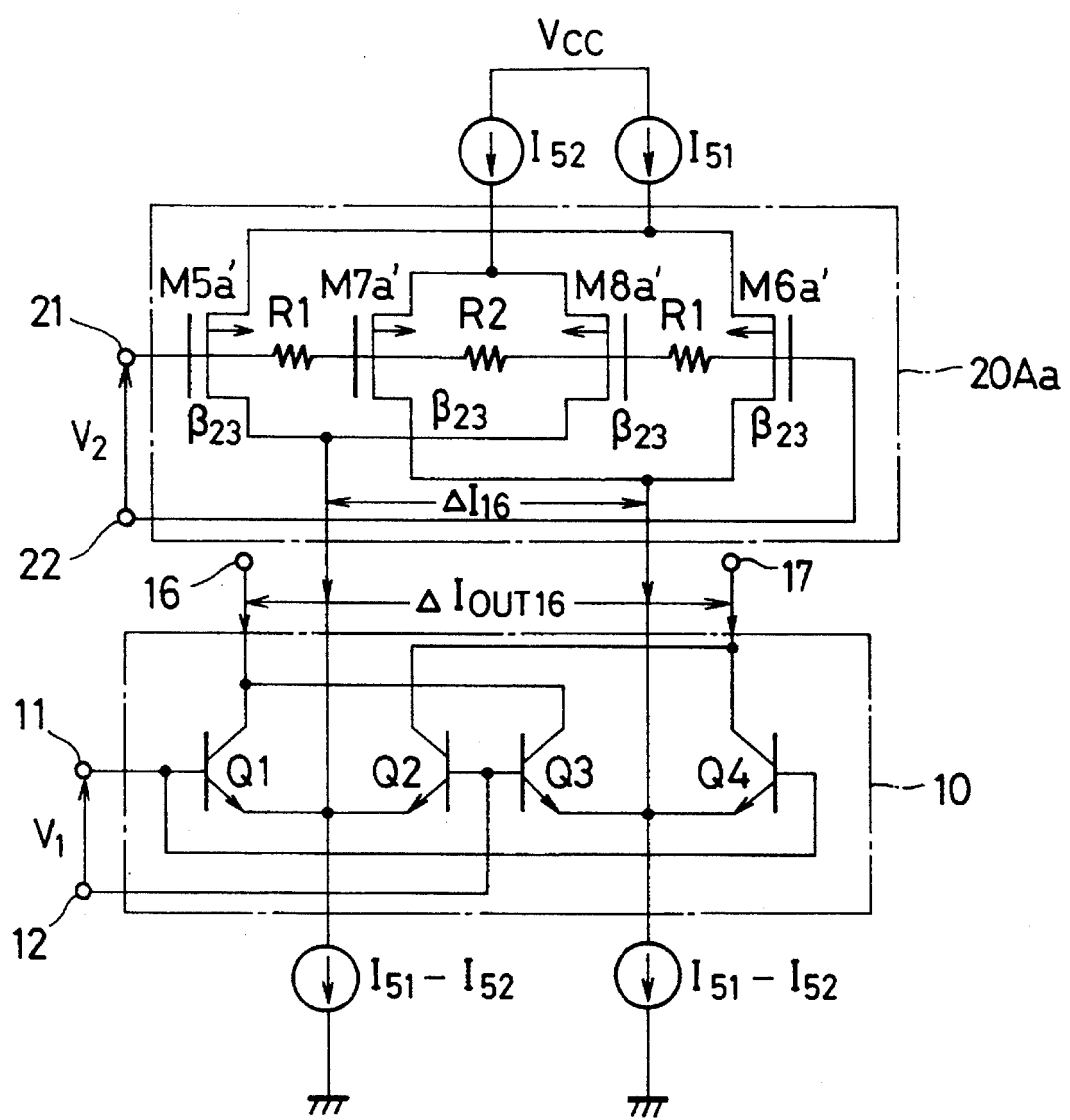
FIG. 12 is a circuit diagram of a Bi-MOS multiplier according to a seventh embodiment of the invention.

FIG. 12 shows a Bi-MOS multiplier according to a seventh embodiment of the invention, which is equivalent to a combination of the cross-coupled, emitter-coupled pairs 10 shown in FIG. 6 and the cross-coupled, source-coupled pairs 20aA shown in FIG. 10.

As shown in FIG. 12, a first constant current source (current: $I_{51}$) is connected to the coupled sources of the MOS transistors M5a' and M6a' and a second constant current source (current: $I_{52}$) is connected to the coupled sources of the MOS transistors M7a' and M8a'. The first current source is disposed between the third differential pair of the MOS transistors M5a' and M6a' and a constant voltage source (voltage; $V_{CC}$). The second constant current source is disposed between the fourth differential pair of the MOS transistors M7a' and M8a' and the constant voltage source.

Additionally, in the seventh embodiment, there is a third constant current source (current: $I_{51}-I_{52}$) between the coupled emitters of the transistors Q1 and Q2 and the ground. Also, there is a fourth constant current source (current: $I_{51}-I_{52}$) between the coupled emitters of the transistors Q3 and Q4 and the ground.

A differential output current $\Delta I_{16}$ of the cross-coupled, source-coupled pairs 20Aa is derived from the coupled drains of the transistors M5a' and M8a' and those of the transistors M6a' and M7a'.

A differential output current $\Delta I_{ooT16}$ of the multiplier is derived from the pair of the output ends 16 and 17.

Because the multiplier of the seventh embodiment is substantially the same in configuration as that of the third embodiment in FIG. 8, the same effect or advantage as that of the third embodiment can be obtained.

Further, there is an additional advantage that the multiplier of the seventh embodiment can operate a lower supply voltage than that of the third embodiment. However, there arises a disadvantage that the total current of the multiplier becomes about three times as much as that of the third embodiment.

[Eighth Embodiment]

Figure 13:
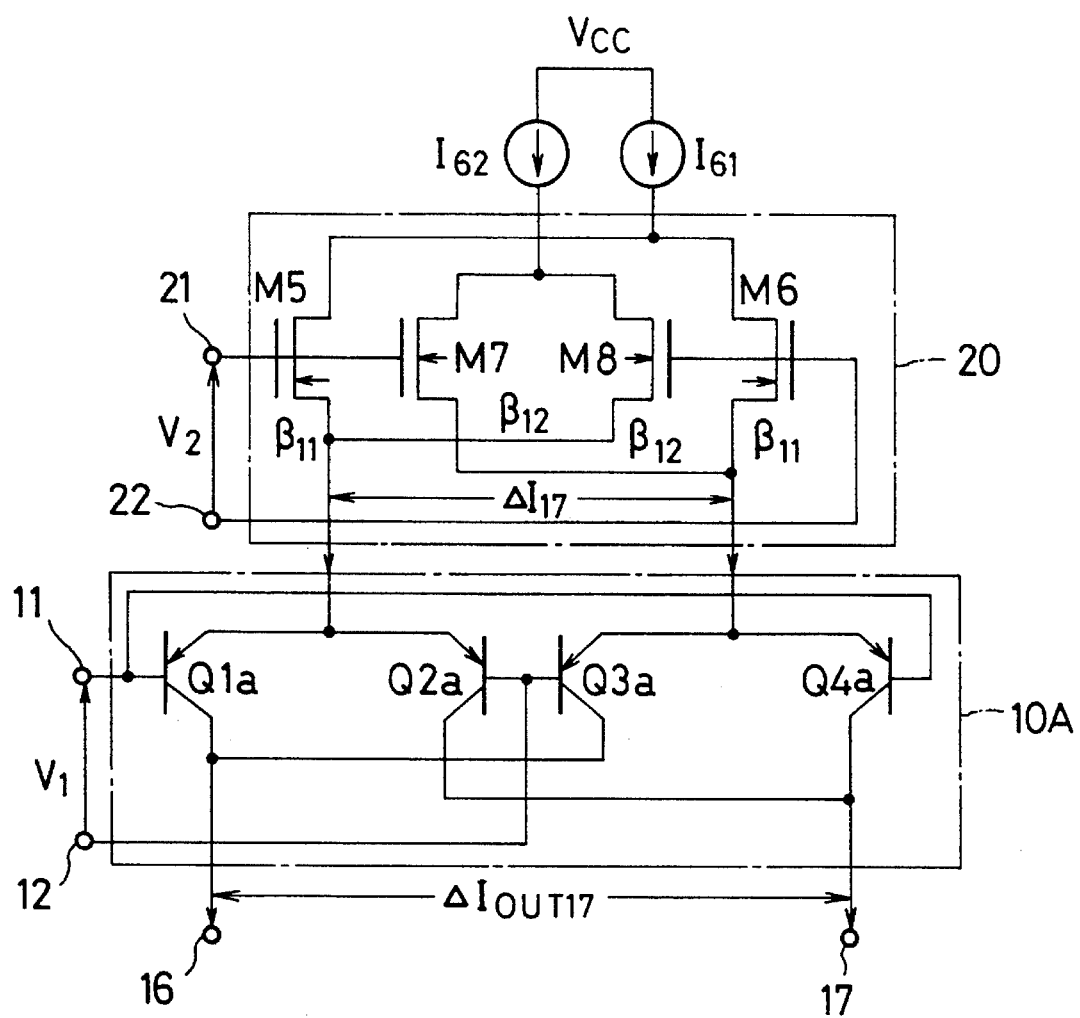
FIG. 13 is a circuit diagram of a Bi-MOS multiplier according to an eighth embodiment of the invention.

FIG. 13 shows a Bi-MOS multiplier according to a eighth embodiment of the invention, which is equivalent to a combination of the cross-coupled, emitter-coupled pairs 10A shown in FIG. 9 and the cross-coupled, source-coupled pairs 20 shown in FIG. 6.

As shown in FIG. 13, a first constant current source (current: $I_{61}$) is connected to the coupled sources of the MOS transistors M5 and M6 and a second constant current source (current: $I_{62}$) is connected to the coupled sources of the MOS transistors M7 and M8. The first current source is disposed between the third differential pair of the MOS transistors M5 and M6 and a constant voltage source (voltage: $V_{CC}$). The second constant current source is disposed between the fourth differential pair of the MOS transistors M7 and M8 and the constant voltage source.

A differential output current $\Delta I_{17}$ of the cross-coupled, source-coupled pairs 20 is derived from the coupled drains of the transistors M5 and M8 and those of the transistors M6 and M7.

A differential output current $\Delta I_{OUT17}$ of the multiplier is derived from the pair of the output ends 16 and 17.

Because the multiplier of the eighth embodiment is substantially the same in configuration as that of the second embodiment in FIG. 6, the same effect or advantage as that of the second embodiment can be obtained.

[Ninth Embodiment]

Figure 14:
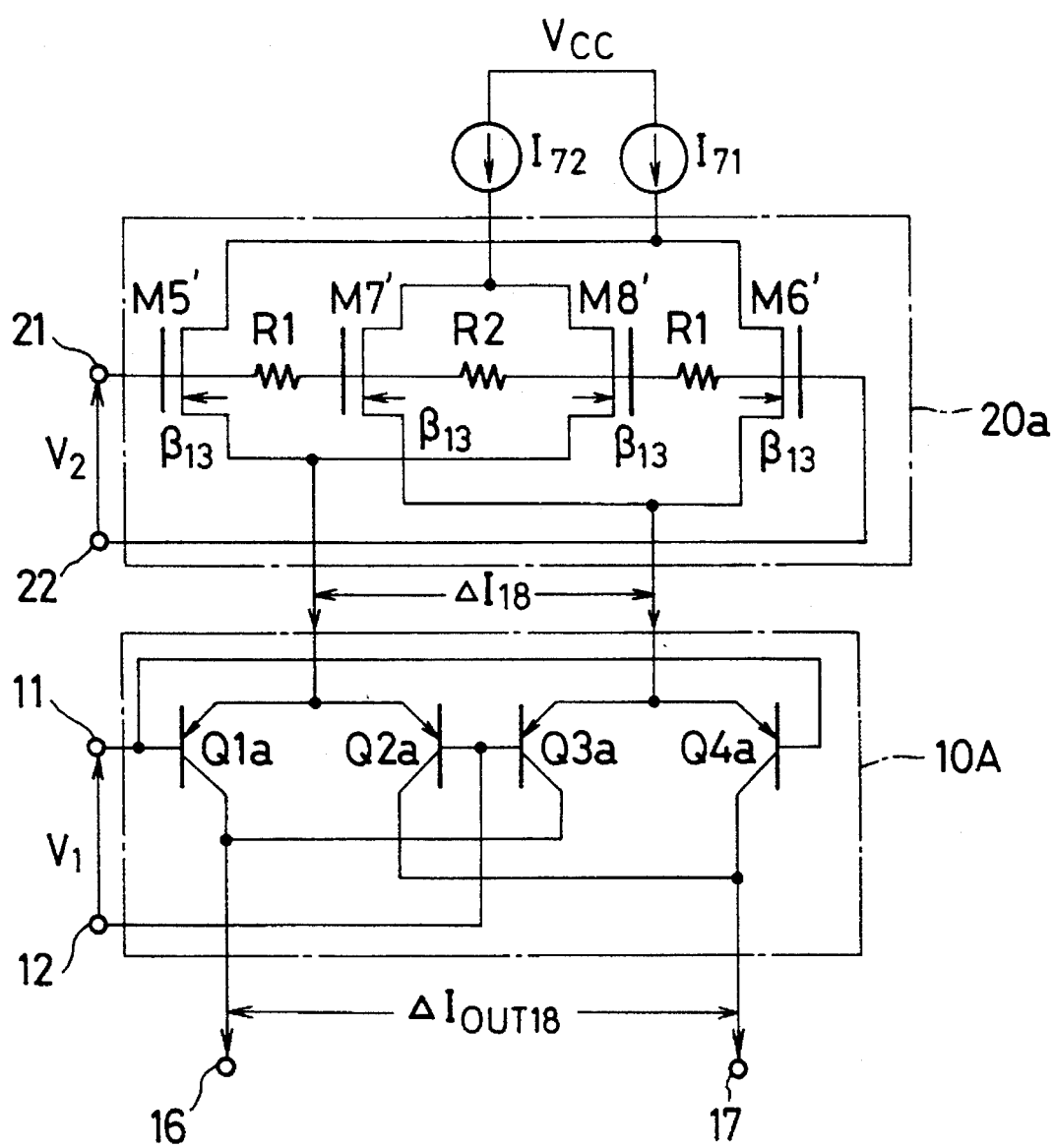
FIG. 14 is a circuit diagram of a Bi-MOS multiplier according to a ninth embodiment of the invention.

FIG. 14 shows a Bi-MOS multiplier according to a ninth embodiment of the invention, which is equivalent to a combination of the cross-coupled, emitter-coupled pairs 10A shown in FIG. 10 and the cross-coupled, source-coupled pairs 20a shown in FIG. 8.

As shown in FIG. 14, a first constant current source (current: $I_{71}$) is connected to the coupled sources of the MOS transistors M5' and M6' and a second constant current source (current: $I_{72}$) is connected to the coupled sources of the MOS transistors M7' and M8'. The first current source is disposed between the third differential pair of the MOS transistors M5' and M6' and a constant voltage source (voltage: $V_{CC}$). The second constant current source is disposed between the fourth differential pair of the MOS transistors M7' and M8' and the constant voltage source.

A differential output current $\Delta I_{17}$ of the cross-coupled, source-coupled pairs 20a is derived from the coupled drains of the transistors M5' and M8' and those of the transistors M6' and M7'.

A differential output current $\Delta I_{OUT17}$ of the multiplier is derived from the pair of the output ends 16 and 17.

Because the multiplier of the ninth embodiment is substantially the same in configuration as that of the third embodiment in FIG. 8, the same effect or advantage as that of the third embodiment can be obtained.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An operational transconductance amplifier comprising:
   a first differential pair of first and second MOS field-effect transistors whose sources are coupled together;
   a first constant current source for driving said first differential pair, said first constant current source being connected to said coupled sources of said first and second transistors;

a second differential pair of third and fourth MOS field-effect transistors whose sources are coupled together;

a second constant current source for driving said second differential pair, said second constant current source being connected to said coupled sources of said third and fourth transistors;

said first, second, third and fourth transistors having the same transconductance parameter;

drains of said first and fourth transistors being coupled together and drains of said second and third transistors being coupled together;

a differential output current of said amplifier being derived from said coupled drains of said first and fourth transistors and said coupled drains of said second and third transistors;

gates of said first and second transistors being applied with a first input voltage; and gates of said third and fourth transistors being applied with a second input voltage, said second input voltage being equal to ($1/C_1$) of said first input voltage, where $C_1$ is a constant greater than unity.

2. The amplifier as claimed in claim 1, further comprising a first resistor connected between said gates of said first and third transistors;

a second resistor connected between said gates of said second and fourth transistors; and said first and second resistors having the same resistance;

wherein said input voltage is applied across said gates of said third and fourth transistors through said first and second resistors, respectively.

3. The amplifier as claimed in claim 2, further comprising a third resistor connected between said gates of said third and fourth transistors, said third resistor having a different resistance from that of said first and second resistors.

4. The amplifier as claimed in claim 2, said first and second resistors are made of patterned polysilicon films, respectively.

5. An operational transconductance amplifier comprising:

a first balanced differential pair of first and second transistors;

a first constant current source for driving said first balanced differential pair;

a second balanced differential pair of third and fourth transistors;

a second constant current source for driving said second balanced differential pair;

said first, second, third and fourth transistors having the same capability;

output ends of said first and fourth transistors being coupled together and output ends of said second and third transistors being coupled together;

a differential output current of said amplifier being derived from said coupled output ends of said first and fourth transistors and said coupled output ends of said second and third transistors;

input ends of said first and second transistors being applied with a first input voltage;

gates of said third and fourth transistors being applied with a second input voltage, said second input voltage being equal to ($1/C_1$) of said first input voltage, where $C_1$ is a constant greater than unity.

6. The amplifier as claimed in claim 5, further comprising a first resistor connected between said input ends of said first and third transistors and a second resistor connected between said input ends of said second and fourth transistors, said first and second resistors having the same resistance.

7. The amplifier as claimed in claim 6, further comprising a third resistor connected between said input ends of said third and fourth transistors, said third resistor having a different resistance from that of said first and second resistors.

8. The amplifier as claimed in claim 6, said first and second resistors are made of patterned polysilicon films, respectively.

9. A Bi-MOS multiplier for multiplying first and second input voltages, comprising:

(a) cross-coupled, emitter-coupled pairs applied with said first input voltage;

(b) cross-coupled, source-coupled pairs applied with said second input voltage; and (c) said cross-coupled, emitter-coupled pairs being driven by a differential output current of said cross-coupled, source-coupled pairs;

(d) said cross-coupled, emitter-coupled pairs being composed of a first differential pair of first and second bipolar transistors whose emitters are coupled together and a second differential pair of third and fourth bipolar transistors whose emitters are coupled together;

said collectors of said first and third bipolar transistors being coupled together and said collectors of said second and fourth bipolar transistors being coupled together, a differential output current being derived from said coupled collectors of said first and third transistors and said coupled collectors of said second and fourth transistors;

bases of said first and fourth transistors being coupled together and bases of said second and third transistors being coupled together, said first input voltage being applied across said coupled bases of said first and fourth transistors and said coupled bases of said second and third transistors;

(e) said cross-coupled, source-coupled pairs being composed of a third balanced differential pair of first and second MOS field-effect transistors whose sources are coupled together, and a fourth balanced differential pair of third and fourth MOS field-effect transistors whose sources are coupled together;

said first and second MOS transistors having the same transconductance parameter $\beta_{11}$ and said third and fourth MOS transistors having the same transconductance parameter $\beta_{12}$;

said coupled sources of said first and second MOS transistors being connected to a first constant current source whose constant current is $I_{01}$, and said coupled sources of said third and fourth MOS transistors being connected to a second constant current source whose constant current is $I_{02}$;

drains of said first and fourth MOS transistors being coupled together to said coupled emitters of said first and second bipolar transistors, and drains of said second and third MOS transistors being coupled together to said coupled emitters of said third and fourth bipolar transistors;

said differential output current of said cross-coupled, source-coupled pairs being outputted from said coupled drains of said first and fourth MOS transistors and said coupled drains of said second and third MOS transistors;

gates of said first and third MOS transistors being coupled together and gates of said second and fourth transistors being coupled together, said second input voltage being applied across said coupled gates of said first and third MOS transistors and said coupled gates of said second and fourth transistors; and said currents $I_{01}$ and $I_{02}$ of said first and second constant current sources and said transconductance parameters $\beta_{11}$ and $\beta_{12}$ of said first, second, third and fourth MOS transistors have such a relationship as $$\left(\frac{\beta_{11}}{\beta_{12}}\right)^{3/2} = \sqrt{\frac{I_{01}}{I_{02}}}$$

10. The multiplier as claimed in claim 9, further comprising a third constant current source whose current is $(I_{01}-I_{02})$ connected to said coupled emitters of said first and second bipolar transistors; and a fourth constant current source whose current is $(I_{01}-I_{02})$ connected to said coupled emitters of said third and fourth bipolar transistors.

11. A Bi-MOS multiplier for multiplying first and second input voltages, comprising:

(a) cross-coupled, emitter-coupled pairs applied with said first input voltage;

(b) cross-coupled, source-coupled pairs applied with said second input voltage; and (c) said cross-coupled, emitter-coupled pairs being driven by a differential output current of said cross-coupled, source-coupled pairs;

(d) said cross-coupled, emitter-coupled pairs being composed of a first differential pair of first and second bipolar transistors whose emitters are coupled together and a second differential pair of third and fourth bipolar transistors whose emitters are coupled together;

said collectors of said first and third bipolar transistors being coupled together and said collectors of said second and fourth bipolar transistors being coupled together, a differential output current of said multiplier being derived from said coupled collectors of said first and third bipolar transistors and said coupled collectors of said second and fourth bipolar transistors;

bases of said first and fourth bipolar transistors being coupled together and bases of said second and third bipolar transistors being coupled together, said first input voltage being applied across said coupled bases of said first and fourth bipolar transistors and said coupled bases of said second and third bipolar transistors;

(c) said cross-coupled, source-coupled pairs being composed of a third balanced differential pair of first and second MOS field-effect transistors whose sources are coupled together, and a fourth balanced differential pair of third and fourth MOS field-effect transistors whose sources are coupled together;

said first, second, third and fourth MOS transistors having the same transconductance parameter $\beta_{13}$;

said coupled sources of said first and second MOS transistors being connected to a first constant current source whose constant current is $I_{11}$, and said coupled sources of said third and fourth MOS transistors being connected to a second constant current source whose constant current is $I_{12}$;

drains of said first and fourth MOS transistors being coupled together to said coupled emitters of said first and second bipolar transistors, and drains of said second and third MOS transistors being coupled together to said coupled emitters of said third and fourth bipolar transistors;

said differential output current of said cross-coupled, source-coupled pairs being outputted from said coupled drains of said first and fourth MOS transistors and said coupled drains of said second and third MOS transistors;

said second input voltage being applied across gates of said first and second MOS transistors and a voltage produced by dividing said second input voltage at a divide ratio $C_2$ ($C_2>1$) being applied across gates of said third and fourth MOS transistors; and said currents $I_{11}$ and $I_{12}$ of said first and second constant current sources and said divide ratio $C_2$ having such a relationship as $$C_2^3 = \sqrt{\frac{I_{11}}{I_{12}}}$$

12. The multiplier as claimed in claim 11, further comprising a third constant current source whose current is $(I_{11}-I_{12})$ connected to said coupled emitters of said first and second bipolar transistors; and a fourth constant current source whose current is $(I_{11}-I_{12})$ connected to said coupled emitters of said third and fourth bipolar transistors.

* * * * *